(12) United States Patent
Nakasugi

(10) Patent No.: US 6,703,629 B2
(45) Date of Patent: Mar. 9, 2004

(54) CHARGED BEAM EXPOSURE APPARATUS HAVING BLANKING APERTURE AND BASIC FIGURE APERTURE

(75) Inventor: Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 09/912,365

(22) Filed: Jul. 26, 2001

(65) Prior Publication Data
US 2002/0011574 A1 Jan. 31, 2002

(30) Foreign Application Priority Data
Jul. 27, 2000 (JP) ..................... P2000-227841
Jul. 23, 2001 (JP) ..................... P2001-222106

(51) Int. Cl.[7] ............................. G21K 5/10
(52) U.S. Cl. ............... 250/492.22; 250/283.1
(58) Field of Search ................. 250/283.1, 492.22

(56) References Cited

U.S. PATENT DOCUMENTS 5,288,567 A * 2/1994 Sakamoto et al. .............. 430/5
5,371,373 A * 12/1994 Shibata et al. ......... 250/492.22
6,323,499 B1 * 11/2001 Muraki et al. ......... 250/492.22

FOREIGN PATENT DOCUMENTS

| JP | 2835140 | 10/1998 | ......... H01L/21/027 |
| JP | 2849184 | 11/1998 | ......... H01L/21/027 |
| JP | 2936102 | 6/1999 | ......... H01L/21/027 |

* cited by examiner

Primary Examiner—Stephen D. Meier
Assistant Examiner—Lam Nguyen
(74) Attorney, Agent, or Firm—Finnegan, Henderson, Farabow, Garrett & Dunner, L.L.P.

(57) ABSTRACT

Two or more-staged masks are prepared for a charged beam generating source. One mask has first aperture sections having rectangular apertures arranged into a lattice form, and electrodes which deflects a beam at respective first aperture sections. The other mask has a second aperture section having basic figure apertures for shaping the beam which passes or passed through the first aperture sections. Layout data of a semiconductor apparatus are divided into sizes of the basic figures which take reduction in exposure into consideration so as to be classified according to the basic figures. The beam which is shaped into a form of an overlapped portion of the divided layouts and the classified basic figure is emitted onto a sample.

12 Claims, 29 Drawing Sheets

A2+B1

A1+B4

A4+B2

A3+B3

117 118 119 120 121 122   138

106 107 108 109 110 111   112 113

CHARGED BEAM EXPOSURE APPARATUS HAVING BLANKING APERTURE AND BASIC FIGURE APERTURE

CROSS REFERENCE TO RELATED APPLICATION

This application is based upon and claims the benefit of priority from the prior Japanese Patent Applications Nos. P2000-227841 and P2001-222106, filed on Jul. 27, 2000 and Jul. 23, 2001; the entire contents of which are incorporated herein by reference.

BACKGROUND OF THE INVENTION

1. Field of the Invention

The present invention relates to exposure using an electron or ion charged beam. More specifically, the invention relates to exposure of an arbitrary pattern under a condition of constant and periodical arrangement of wirings, standard cells and the like of a semiconductor apparatus.

2. Description of the Related Art

An electron-beam exposure technique enables processing of fine patterns of not more than submicron-meter which cannot be produced by photolithography. For this reason, the electron-beam exposure technique is becoming essential for a semiconductor processing technique which requires refining, high-integration and complication.

In variable shaped beam (VSB) exposure which is a typical electron-beam exposure method, a mask is not required for exposure regardless of pattern forms. In the VSB exposure, since exposure is repeated by dividing a pattern into a lot of minute rectangular shots, the exposure takes longer time, and there is a disadvantage that throughput cannot be obtained.

In order to heighten the throughput, character projection (CP) exposure technique (partial collective exposure), which is capable of collectively shooting a pattern having a certain size, is devised. In the CP exposure technique, an electron beam emitted from an electron gun is shaped into a rectangle by a first aperture. A desired character is selected from CP apertures having plural character shapes formed on a CP aperture array. The electron beam shaped into the rectangle is shaped into the desired character form. Finally, the electron beam having the character form is reduced so as to be emitted onto a desired portion of a sample. In the CP exposure, portions (character section) of plural desired patterns are created on the aperture array, and exposure is successively carried out for each character created on the aperture array. As the character, a pattern which is exposed repeatedly many times is selected. However, in this CP exposure, a mask should be created for each pattern. Namely, in the case where similar patterns are different partially, one aperture cannot be used commonly. For this reason, the variable shaped beam exposure is also used, and sufficient throughput cannot be obtained. Further, in this CP exposure, there arises a problem that thermal expansion warpage of a mask, which occurs when an electron beam is emitted to the mask, is large and pattern position accuracy is lowered.

In addition, an electron-beam mask transfer system is also suggested. This uses a mask including all desired patterns instead of CP aperture array so as to collectively transfer the patterns. This electron-beam mask transfer system has a problem that mask production costs an enormous amount of money.

A blanking aperture array (BAA) system is also suggested. This uses an array where not less than hundreds of thousands of apertures, which can deflect an electron beam passing therethrough by means of an electric signal, are arranged into a lattice form, and creates a desired beam shape by means of signal control. However, this BAA system has a problem that an apparatus for controlling signal of the BAA section is very expensive.

SUMMARY OF THE INVENTION

The feature of the present invention is a charged beam exposure apparatus including:

a charged beam generating source;

a first flat board which has a plurality of first aperture sections having rectangular apertures arranged close to one another and electrodes for deflecting the beam passing through the first aperture sections at the respective apertures; and a second flat board which is arranged parallel with the first flat board and has second aperture sections having basic figure apertures for shaping the beam, which passes or passed through the first aperture sections.

Other and further objects and features of the present invention will become obvious upon an understanding of the illustrative embodiments about to be described in connection with the accompanying drawing or will be indicated in the appended claims, and various advantages not referred to herein will occur to one skilled in the art upon employing of the invention in practice.

BRIEF DESCRIPTION OF THE DRAWINGS

FIG. 3A is a bird's-eye view of the second aperture array, and

FIG. 3B is a sectional view of the second aperture array.

DETAILED DESCRIPTION OF THE EMBODIMENTS

Figure 1A:
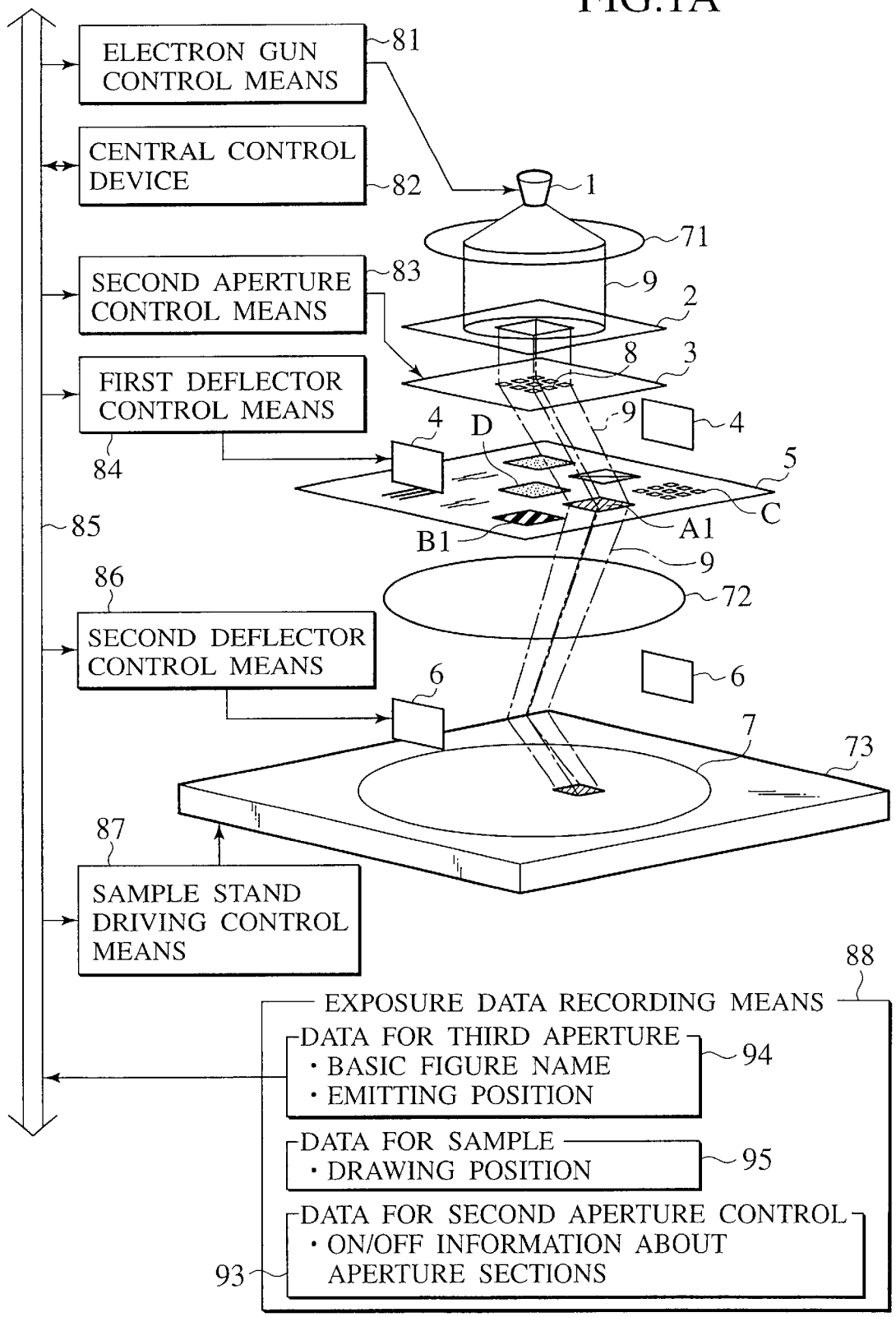
FIGS. 1A and 1B are conceptual diagrams of an electron beam exposure apparatus according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

FIG. 1 is a conceptual diagram of a charged beam exposure apparatus according to the first embodiment. The charged beam exposure apparatus according to the first embodiment has an electron gun 1, a blanking aperture array 3, and a basic figure aperture array 5.

The electron gun 1 is a charged beam generating source. "Charged beam" is an electron beam 9 and an ion beam. The following embodiment will explain the electron beam 9. The following explanation can be applied also to the ion beam in a manner that words are replaced.

FIG. 1A is a conceptual diagram and does not show a lens system for simplification. A more concrete structure of optical system of the charged beam exposure apparatus shown in FIG. 1A is shown in FIG. 1B.

Figure 1B:
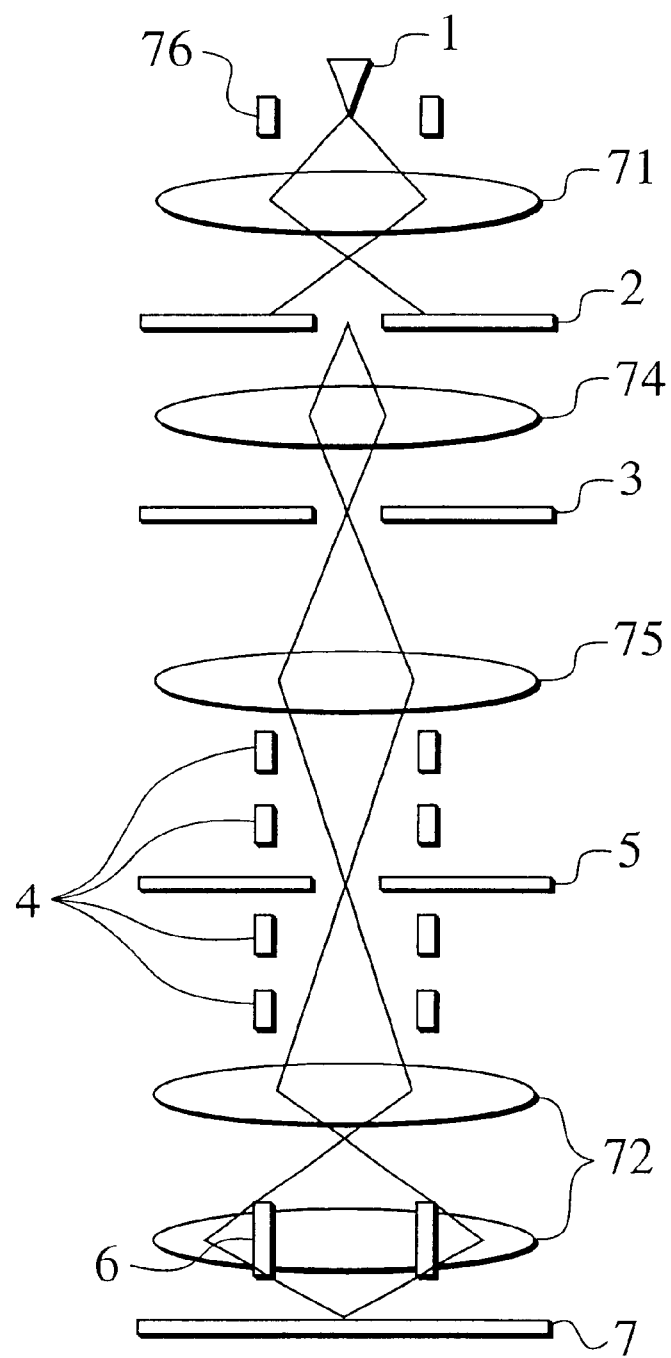

FIG. 1B shows more detailed structure of the optical system of the charged beam exposure apparatus shown in FIG. 1A.

The electron gun 1 contains a blanker 76. A voltage is applied to the blanker 76 by the electron gun control means 81 so that the electron beam is brought into on or off state.

The electron beam 9 is controlled so as to have desired current density by the first lens 71 (condenser lens) so as to be emitted onto the first aperture 2.

The electron beam 9 which passed through the first aperture 2 is emitted onto the second aperture 3 (blanking aperture array) by a first projection lens 74. Further, the electron beam 9 which passed through the second aperture 3 is emitted onto the third aperture 5 (basic figure aperture array) by a second projection lens 75.

The first deflector (means) 4 is composed of four stages. The first deflector deflects the electron beam 9. The second deflector returns the electron beam 9 to an angle vertical to the third aperture. The third deflector returns the electron beam 9 which passed through the third aperture onto an optical axis, and the fourth deflector returns the electron beam 9 to a direction parallel with the optical axis.

The electron beam 9 which is return to the optical axis is reduced and projected and exposed on the sample 7 by a second lens 72 (reduction lens) and objective lens 9. The exposing position of the sample 7 is controlled by the second deflector (deflecting means: objective deflector) 6.

Figure 2:
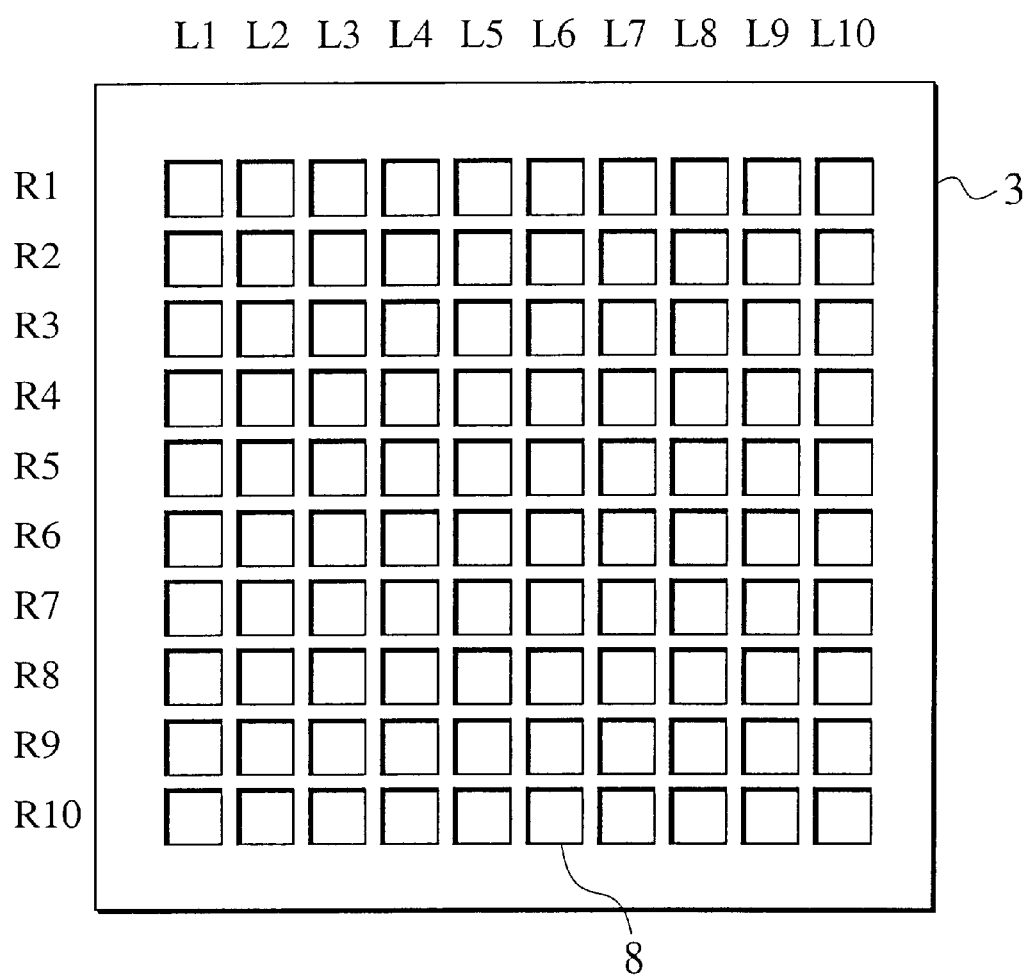
FIG. 2 is an upper surface diagram of a second aperture array (blanking aperture array) according to the first embodiment.
Figure 3A:
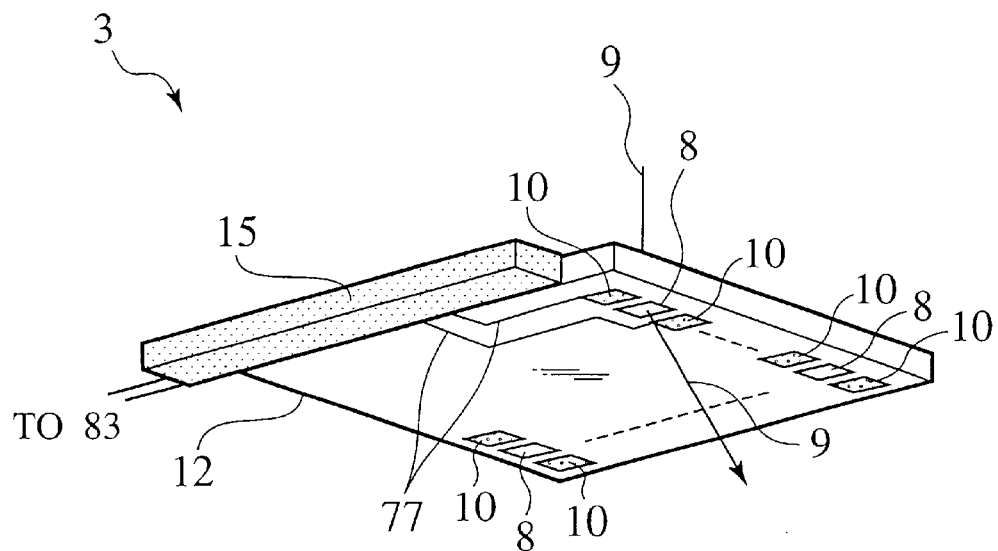
FIGS. 3A and 3B are diagrams showing a structure and a function of the second aperture array according to the first embodiment.
Figure 3B:
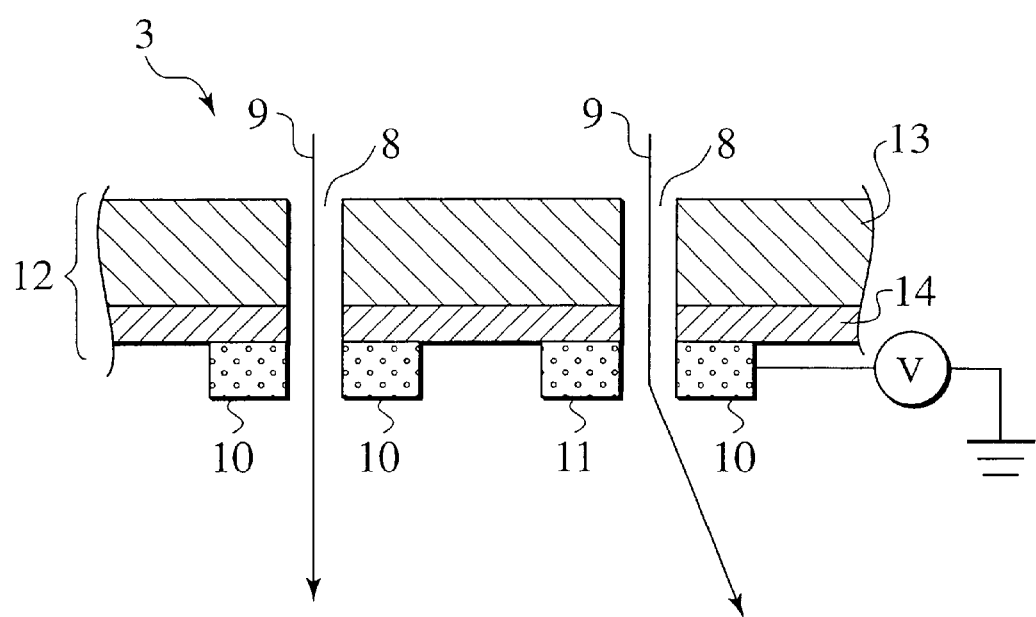

As shown in FIG. 2, the blanking aperture array 3 of the first embodiment is a flat board which has a plurality of first aperture sections 8 having rectangular apertures and arranged in a lattice form so as to be close to each other. The first aperture sections are arranged cyclically. The "aperture section" 8 is an iris of the electron beam 9. Moreover, as shown in FIGS. 3A and 3B, the blanking aperture array 3 has electrodes 10 which deflect the electron beam 9 passing through the first aperture sections 8 at the first aperture sections 8 respectively. The blanking aperture array 3 deflects the electron beam 9 at each aperture section so as to or not to emit the electron beam 9 onto a basic figure, namely, brings the beams into an on/off state.

Figure 4A:
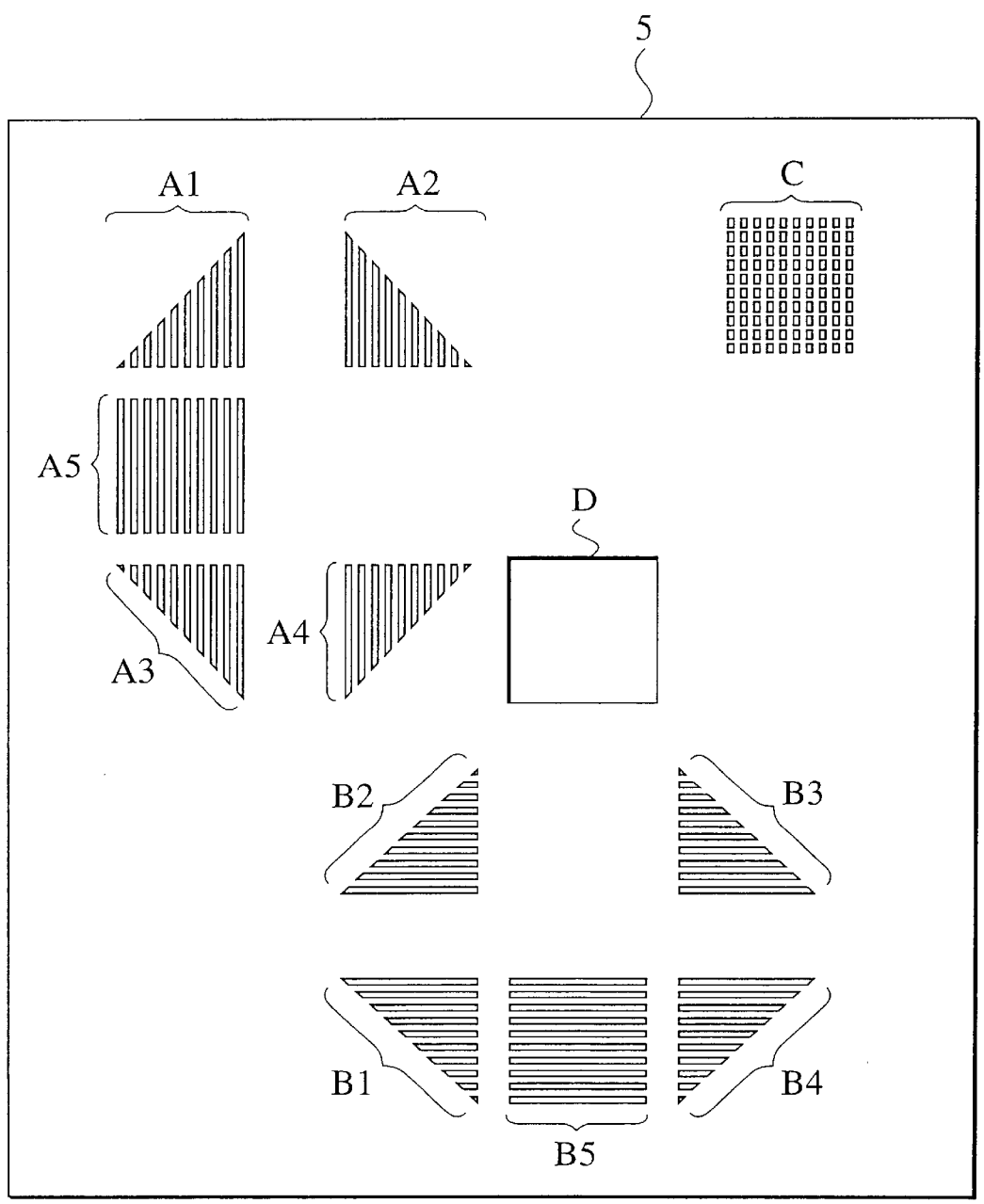
FIGS. 4A to 4E are upper surface diagrams of a third aperture array (basic figure aperture array) according to the first embodiment.

As shown in FIG. 1, the basic figure aperture array 5 of the first embodiment is a second flat board which is arranged parallel with the blanking aperture array 3. The basic figure aperture array 5 has second aperture sections A1 to A5 and B1 to B5 and C having basic figure apertures as shown in FIG. 4A. The second aperture section A1 or the like shapes the electron beam 9 which is about to pass or passed through the first aperture sections 8. The aperture section D is used to shape a variable shaped beam. "About to pass or passed" means that the electron beam first passes through the first aperture sections 8 and next through the second aperture section A1 or the like or the passing order may be reversed. More specifically, the blanking aperture array 3 and the basic figure aperture array 5 form two-stage apertures for the electron gun 1, but the blanking aperture array 3 or the basic figure aperture array 5 may be arranged on the side of the electron gun 1. "The basic figure" is basically a desired pattern. As pattern of wirings in a semiconductor apparatus, "the basic figure" may be set as follows. In the semiconductor apparatus, a width and intervals of wirings are uniform, and the wirings are bent at right angles. However, lengths of the wirings are different from one another. Here, the widths and the intervals of the wirings (or their ratio) are the same as a desired semiconductor apparatus, and the lengths of the wirings are set to a certain length. The pattern of such wirings is determined as "basic figure".

As a result, in the case where the wiring pattern is short, one portion of the "basic figure" is used, and in the case where the pattern is long, the "basic figure" is used repeatedly and partially so that the wiring pattern can be represented by the "basic figure". The "basic figure" is a figure which has a basic rule of the wiring pattern such as the width and interval of the wirings. The basic figure aperture array 5 having the basic figures draws a figure according to the basic rule, and lattice-shaped blanking aperture array 3 can cut unnecessary portion of the drawn figure. Namely, the length of the wiring in the wiring pattern can be shortened to a desired length. As a result, for example, since a pattern for each length of the wirings should not be prepared, a number of masks or the like can be reduced. The mask production cost can be reduced, and throughput in exposure can be improved.

As shown in FIG. 1, the charged beam exposure apparatus has a first deflector 4 for emitting the electron beam 9 which passed through the first aperture sections 8 onto the second aperture section A1 or the like. A basic figure selection deflector which is called as the first deflector 4 emits the beam 9 which passed through the second aperture array 3 onto an arbitrary position on the basic figure aperture array to be the third aperture array 5.

The charged beam exposure apparatus has a second deflector 6 for emitting the electron beam 9 which passed through the second aperture section A1 or the like onto an arbitrary position on a sample 7. The charged beam exposure apparatus has a second lens 72 for imaging the electron beam 9 which passed through the second aperture section A1 or the like on a surface of the sample 7. An objective deflector which is called as the second deflector 6 transfers the electron beam 9 which passed through the basic figure aperture array 5 onto an arbitrary position of the sample 7. The second lens 72 as an imaging lens system images the electron beam 9 which passed through the basic figure aperture array 5 on the sample.

The "sample" 7 is a semiconductor substrate such as silicon (Si) to be used for producing a semiconductor apparatus, and a glass substrate to be used for a mask for exposure. As a result, the plural basic figures A1 to A5 and B1 to B5 and C can be used according to the pattern of a semiconductor apparatus. For example, as for the wiring pattern, the wiring pattern, where wirings in a vertical direction and wirings in a horizontal direction are combined, can be formed. Moreover, since the second lens 72 is provided, a refined pattern can be easily formed.

The blanking aperture array 3 has the aperture sections 8 and the electrodes 10 according to LSI wiring pitch. Moreover, the basic figure aperture array 5 has basic figures according to the LSI wiring pitch. Here, the "LSI wiring pitch" is a repeating interval of the wirings of a large-scale integrated circuit (LSI) of the semiconductor apparatus. The aperture sections and the electrodes are allowed to correspond to the pitches so that the lengths of the wirings can be adjusted independently. Moreover, the basic figures are allowed to correspond to the pitches so that the basic figures can be used for the exposure of the wiring pattern.

A ratio of the width of the first aperture sections 8 to the interval of the first aperture sections 8 is larger than a ratio of the width of the second aperture section A1 to the interval of the second aperture section A1. For this reason, shape of the basic figure A1 or the like can be prevented from being chipped due to shadow of the first aperture sections 8.

The shapes of the apertures of the second aperture section A1 or the like are a wiring pattern on straight lines in the vertical and horizontal directions and a connection pattern having a right-angled portion connecting the vertical and horizontal wirings. The wiring pattern and the connection pattern are a plurality of patterns with different rotational directions and right, left, up and down inverted patterns. As the basic figure, wiring patterns on the straight lines of the vertical and horizontal directions are prepared. Further, connection patterns which have a right-angled portion connecting the wirings in the vertical and horizontal directions or connection patterns that the right angled portions can be composed by combinations are prepared. The connection patterns have a relation with right, left, up and down inverted patterns so as to be capable of coping with connection in every case of the wirings in the vertical and horizontal directions.

The second aperture section A1 or the like includes first slits which are arranged parallel with the vertical sides of the rectangles so as to be opposed to one another with uniform intervals, and second slits which are parallel with the horizontal sides of the rectangles so as to be opposed to one another with uniform intervals. Here, the "slit" is an elongate aperture section, and it corresponds to the wiring pattern. As a result, the wiring pattern having arbitrary lengths in the vertical and horizontal directions can be obtained.

As for the first slits, their lengths are equal with one another, and their both ends are arranged on the straight line, and a number of them is the same as a number of lines of lattice of the blanking aperture array 3. Moreover, as for the second slits, their lengths are equal with one another, their both ends are arranged on the straight line, and a number of them is the same as a number of rows of the lattice of the blanking aperture array 3. As a result, a plurality of wiring patterns can be formed by one beam emission.

Further, as shown in FIG. 1A, the electron beam exposure apparatus of the first embodiment has the first lens 71 for controlling current density of the electron beam 9 emitted from the electron gun 1.

The electron beam exposure apparatus of the first embodiment has a first aperture 2 for forming the shape of the electron beam 9 into a rectangle in order to prevent an excessive electron beam 9 from being emitted onto the second aperture array 3 or the like.

In addition, the electron beam exposure apparatus has a sample stand 73 having driving means and sample stand driving control means 87. As a result, the sample 7 can be moved to a desired position.

The electron beam exposure apparatus has electron gun control means 81, a central control device 82, second aperture array control means 83, first deflector control means 84, second deflector control means 86 and exposure data recording means 88. The central control device 82 controls the electron gun control means 81, the second aperture array control means 83, the first deflector control means 84, the second deflector control means 86, the sample stand driving control means 87 and the exposure data recording means 88 via a bus 85 so as to be capable of executing the exposure method.

Data 94 for third aperture array, data 95 for sample and data 93 for second aperture array control for each shot of the electron beams 9 are recorded in the exposure data recording means 88. Data 94 for third aperture array include basic figure names as identifying tags which can identify the basic figures, and emitted positions of the electron beam 9 in the basic figures. The data 95 for sample include emitted positions of the sample 7 of the electron beam 9. The data 93 for second aperture array control include on/off information 93 showing existence/non-existence of deflection for each aperture section 8.

The electron gun control means 81 controls the on/off state of the electron beam 9 emitted from the electron gun 1 at timing specified by the central control device 82. The second aperture array control means 83 sets all the aperture sections 8 to on or off state based on the data 93 for second aperture array control at timing specified by the central control device 82. The first deflector control means 84 applies a control voltage at timing specified by the central control device 82 so that the electron beam 9 can be emitted to a direction based on the data 94 for the third aperture array. The second deflector control means 86 applies a control voltage at timing specified by the central control device 82 so that the electron beam 9 can be emitted to a direction based on the data 95 for sample. The sample stand driving control means 87 moves the sample stand 73 at timing specified by the central control device 82 so that the electron beam 9 can be emitted to a direction based on the data 95 for sample.

The electron beam 9 shot from the electron gun 1 passes through the first aperture 2, and is shaped into a desired shape on the second aperture array 3. The electron beam 9 is imaged on the third aperture array 5, and passes through the second deflector 6 and the imaging lens system 72 so as to be exposed in a desired position of the sample 7. In embodiments 1 and 2 explained below, an acceleration voltage of the electron beam 9 is 5 kV.

FIG. 2 is an upper surface diagram of the blanking aperture array 3 according to the first embodiment. The aperture sections 8 are provided on the blanking aperture array 3. The aperture sections 8 are arranged according to the wiring pitch of the semiconductor apparatus (LSI). The aperture sections 8 are square, and they are arranged into square lattice form composed of 10 lines (L1 to L10) and ten rows (R1 to R10). Namely, their total number is 100 at the utmost. For example, when the wiring width and the wiring interval are 0.1 $\mu$m and the wiring pitch is 0.2 $\mu$m and a reduction rate from the array 3 to the sample 7 is 1/5, pitches of the aperture sections 8 in the line direction and the row direction on the array may be set to 1 $\mu$m. As a result, all the one-hundred aperture sections 8 can be arranged within an area which is 10 by 10 $\mu$m square.

The two aperture arrays 3 and 5 have different functions. A position where the wirings are arranged is determined on the aperture array 3, and a shape in this position is determined on the aperture array 5. For this reason, a structure such that the shape cannot be controlled on the aperture array 5 is not permitted on the aperture array 3. More specifically, a ratio of the width of the aperture section 8 to a distance between the aperture sections 8 is set to be larger than the ratio of the width of the wiring to the intervals between the wirings. In the above example, since the ratio of the width of the wiring to the interval between the wirings is 1, the ratio of the width of the aperture section to the intervals between the aperture sections may be more than 1, but 4 or more is preferable. It is considered that the maximum value of the actual ratio is obtained when the arrangement is such that the interval between the aperture sections has a minimum machining dimension. Since the width of the wirings is generally set to the minimum machining dimension, the ratio becomes about 10 (1 $\mu$m/0.1 $\mu$m). Namely, the ratio becomes 10 which is obtained by multiplying an inverse number 5 of the reduction rate by the ratio 2 of the wiring pitch.

FIG. 3A is an outside view of the second aperture array 3 according to the first embodiment. The second aperture array 3 has an aperture substrate 12, the aperture sections 8 which are opened in the aperture substrate 12, the electrodes 10 which are arranged on both sides so as to be opposed to one another across the aperture sections 8, and an I/O interconnection and terminal 77 connected with the electrodes 10. The I/O interconnection and terminal 77 is connected with the second aperture array control means 83 for outputting a control signal to be on/off information of the aperture sections 8. Moreover, a mask holder 15 for fixing the array 3 to the exposure apparatus may be arranged on a side surface of the array 3.

FIG. 3B is a schematic sectional view of the second aperture array 3 according to the first embodiment. The aperture substrate 12 is composed of a silicon (Si) substrate 13, and an insulating film 14 which is arranged on a rear surface of the substrate 13. An electron beam deflection voltage which is a control signal from the second aperture array control means 83 is applied to the electrodes 10 via the I/O interconnection and terminal 77 provided on the mask holder 15. In the case where the deflection voltage is not applied to the electrodes 10, the electron beam 9 emitted onto the second aperture array 3 goes straight to the aperture sections 8 so as to be emitted onto the third aperture array 5. Meanwhile, in the case where the deflection voltage is applied to the electrodes 10, an electric field is generated between the electrodes 10 and 11, and the electron beam 9 is deflected so as not to be emitted onto the third aperture array 5. In such a manner, the existence/non-existence of the deflection due to the aperture sections 8 is controlled by the on/off information of the aperture sections 8 which is the control signal from the control means 83. The pattern form which is formed by a plurality of the aperture sections 8 on the on state is emitted onto the third aperture array 5. Here, the deflection voltage V for non-emission is about 30 V.

FIGS. 4A to 4E are upper surface diagrams of the basic figure aperture array 5 according to the first embodiment. The basic figure aperture array 5 has aperture sections of the basic figures A1 to A5, B1 to B5 and C and a rectangular aperture section D. The basic figures A1 to A5 and B1 to B5 are composed of 10 apertures which have widths and are arranged with intervals according to the wiring pitch of the semiconductor apparatus. Their size is fit within the area which is 10 by 10 $\mu$m square. The size is the same as the size such that the one-hundred aperture sections 8 are fit on the array 3. The same sizes are adopted in order to simplify the principle of the exposure, mentioned below. As a result, the positional relationship between the arrays 3 and 5 can be easily understood by overlapping the arrays 3 and 5. Therefore, the electron beam 9 is increased or reduced by a constant rate between the second aperture array 3 and the third aperture array 5 so that the basic figure which is increased or reduced by the same rate may be used for the size of the one-hundred aperture sections 8 of the array 3.

There will be explained below a form of the basic figure A5. The basic figure A5 is composed of ten congruent rectangles. A length of the lateral side of the rectangle is 0.5 $\mu$m, and a length of the longitudinal side is 10 $\mu$m. The rectangles are arranged so that extended lines of the two lateral sides of the ten rectangles coincide with each other. Moreover, the rectangles are arranged with equal intervals, and the intervals are 0.5 $\mu$m. This is because the width and the interval of the wirings are, for example, set to 0.1 $\mu$m. A ratio of the length of the lateral side to the interval between the rectangles may be the same as the ratio of the width of the wirings to the interval between the wirings.

The basic figure A1 is congruent with the figure below the figure A5 which is divided into two by a straight line connecting an upper-right angle of the right-end rectangle and a lower-left angle of the left-end rectangle. The basic figure A1 is arranged so as to be capable of being overlapped with the figure below the figure A5 by parallel movement. Here, in the case of "be capable of being overlapped", the arranging direction is limited and also the figures are congruent with each other. For this reason, except for a particularly necessary case, "congruent" is not described according to the description of "be capable of being overlapped".

The basic figure A2 can be overlapped with a figure which is obtained as axisymmetry of the figure A1 by only parallel movement of the obtained figure with respect to a parallel line with the longitudinal side of the rectangle of the figure A5.

The basic figure A3 can be overlapped with a figure which is obtained as axisymmetry of the figure A1 by only parallel movement of the obtained figure with respect to a parallel line with the lateral side of the rectangle of the figure A5.

The basic figure A4 can be overlapped with a figure which is obtained as axisymmetry of the figure A3 by only parallel movement of the obtained figure with respect to a parallel line with the longitudinal side of the rectangle of the figure A5.

The basic figure B1 can be overlapped with the figure A1 by rotating the figure A1 through 90° in the counterclockwise direction and moving it parallel.

The basic figure B2 can be overlapped with the figure A2 by rotating the figure A2 through 90° in the counterclockwise direction and moving it parallel.

The basic figure B3 can be overlapped with the figure A4 by rotating the figure A4 through 90° in the counterclockwise direction and moving it parallel.

The basic figure B4 can be overlapped with the figure A3 by rotating the figure A3 through 90° in the counterclockwise direction and moving it parallel.

The basic figure B5 can be overlapped with the figure A5 by rotating the figure A5 through 90° in the counterclockwise direction and moving it parallel.

The basic figure C is obtained as an area where the figures A5 and B5 are overlapped with each other when the figure B5 is moved parallel so that the longer left side of the left-end rectangle of the figure A5 coincides with the shorter left side of the ten rectangles of the figure B5. The figure C forms a plug to be an inter-layer wiring when the multi-layer wiring is formed, but the figure C is provided in order to form a via hole when the plug is formed. In the above embodiment, the vertical and horizontal straight line patterns A and B and the plug C are shown as the basic figures, but another patterns may be used as the basic figures.

Figure 4B:
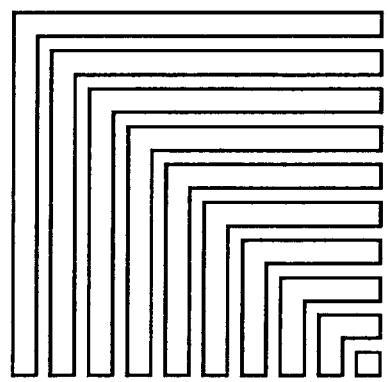
Figure 4C:
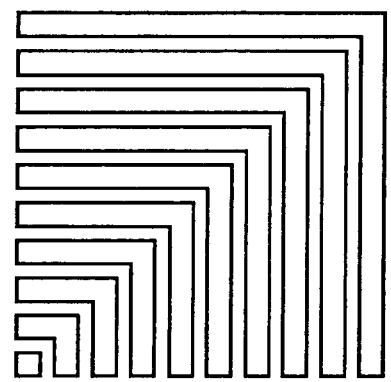
Figure 4D:
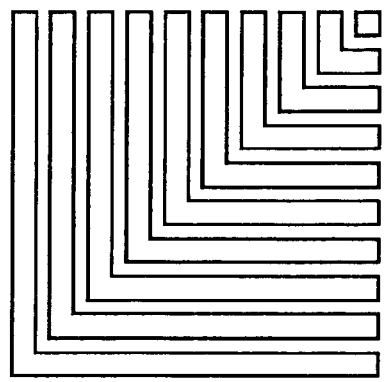
Figure 4E:
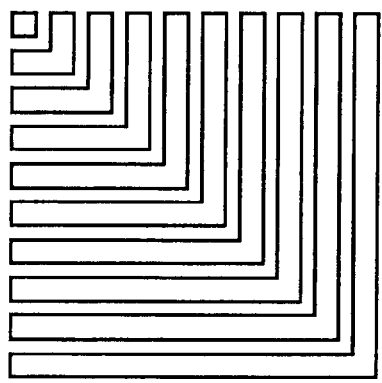

FIG. 4B is a basic figure (A2+B1) which is formed by synthesizing the basic figures A2 and B1. Similarly, a basic figure (A1+B4) of FIG. 4C is formed by synthesizing the basic figures A1 and B4. A basic figure (A4+B2) of FIG. 4D is formed by synthesizing the basic figures A4 and B2. A basic figure (A3+B3) of FIG. 4E is formed by synthesizing the basic figures A3 and B3.

In addition, a rectangular aperture section D of FIG. 4A is an aperture for VSB. A pattern which cannot be exposed by using the basic figures is conventionally provided for VSB exposure. In the case where the VSB exposure is carried out, it is necessary to image the second aperture array image on the third aperture array image. This point is similar to the conventional charged beam exposure apparatus, but in the case where only CP exposure is carried out, it is not always necessary to image the second aperture array image on the third aperture array image. On the contrary, it is necessary not to image edges of the aperture sections 8 of the second aperture array 3 on the third aperture array image. Namely, the image of the aperture sections 8 on the third aperture array 5 is slightly unfocused so that the images are slightly overlapped with each other. These optical conditions can be set arbitrarily by using the first projection lens 74, the second projection lens 75 and the like shown in FIG. 1B according to a pattern to be exposed.

Figure 5A:
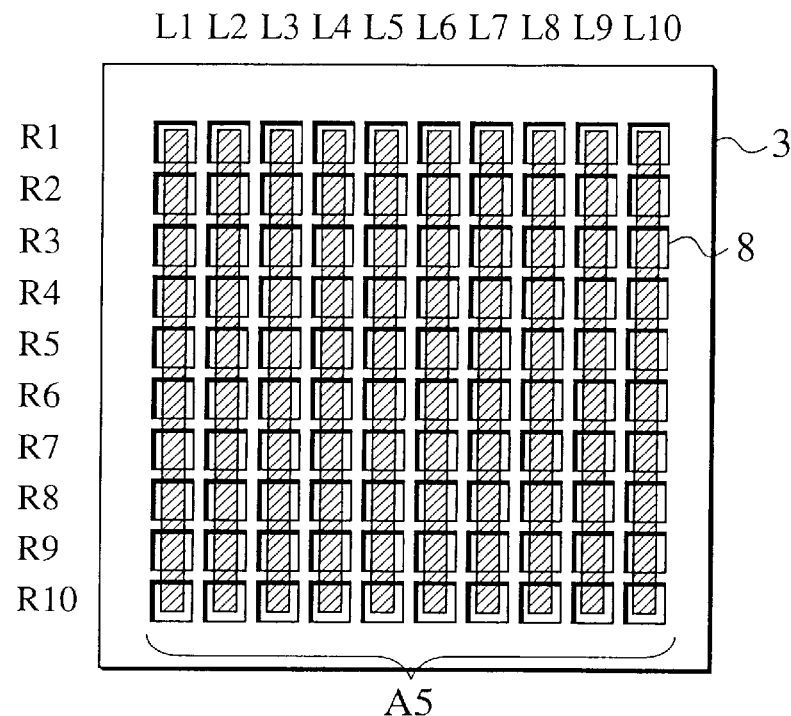
FIGS. 5A and 5B are diagrams showing a positional relationship between the second aperture array and the third aperture array.

FIG. 5A is a diagram showing a positional relationship between the aperture sections 8 of the second aperture array 3 and the basic figure A5 of the third aperture array 5. The figure A5 is arranged so as to be overlapped with all the lines (L1 to L10) of the aperture sections 8. Moreover, the figure A5 is arranged so as to be overlapped with all the rows (R1 to R10). Two or more apertures of the basic figure are not overlapped with one aperture section 8. The sides of the square aperture sections 8 are parallel with the sides of the rectangles of the figure A5. The rectangle of the figure A5 is not arranged on three or more sides of the square of one aperture section 8.

Figure 5B:
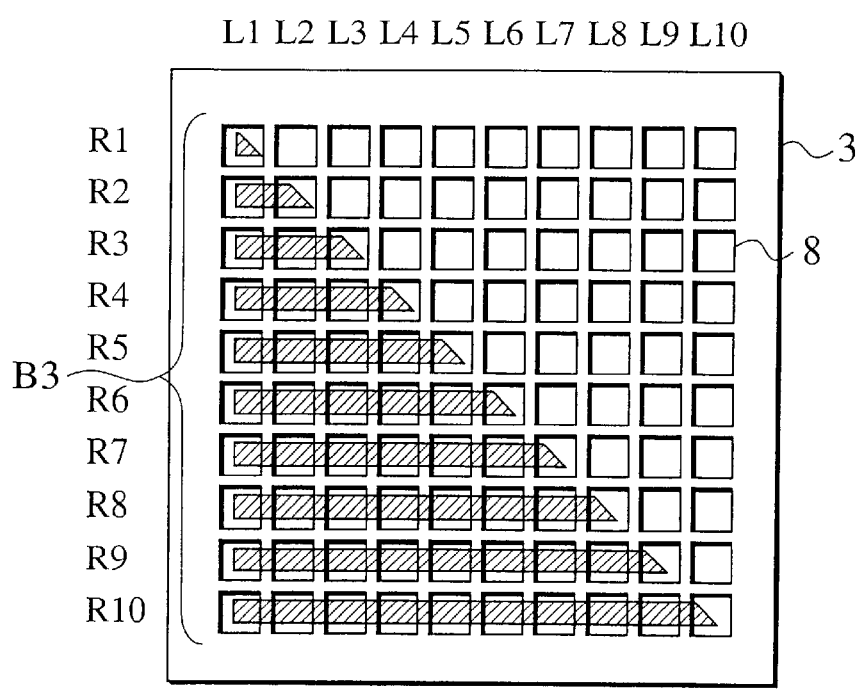

FIG. 5B is a diagram showing a positional relationship between the aperture sections 8 of the second aperture array 3 and the basic figure B3 of the third aperture array 5. The figure B3 is arranged so as to be overlapped with all the lines (L1 to L10) of the aperture sections 8. Namely, there is no line where the figure B3 does not exist. Moreover, the figure B3 is arranged so as to be overlapped with all the rows (R1 to R10). Namely, there is no row where the figure B3 does not exist. Two or more apertures of the basic figure are not overlapped with one aperture section 8. The sides of the square aperture sections 8 are parallel with the sides of the rectangles of the figure B3. The figure B3 is not arranged on three or more sides of the one square aperture section 8.

At the time of drawing in exposure, selection is made from the apertures A1 to A5, B1 to B5 and C as the basic figures of the third aperture array 5, and the control voltage V is applied to each aperture section 8 so that the electron beam 9 which passes through the second aperture array 3 is deflected according to the pattern form which is desired to be drawn. The electron beam 9 passes through the second aperture array 3 and the third aperture array 5 so as to be emitted into the form of the pattern to be drawn on the sample 7.

In such a manner, the basic figure apertures A1 to A5, B1 to B5, C, (A2+B1) and the like to be references are created so that one basic figure aperture A1 to A5, B1 to B5, C, (A2+B1) or the like can be applied to a plurality of patterns according to the beam 9 form of the second aperture array 3. As a result, in comparison with a number of CP apertures in the conventional CP system, a number of the apertures can be reduced. Due to this reduction, the mask cost can be reduced further than a mask in the electron-beam mask transfer system.

In addition, since only the electron beam 9 required for the formation of the pattern on the first aperture 2 is emitted onto the second aperture array 3, an amount of the electron beam 9 to be emitted onto the aperture array 3 can be small. As a result, chromatic aberration can be prevented, and also contamination which easily occurs on the second aperture array can be avoided. The electron beam 9 passes through the aperture sections 8 also on the aperture array 3, and thus an amount of the electron beam 9 to be emitted onto the third aperture array 5 itself can be small. As a result, the preventive measures similar to the above are taken. An amount of the electron beam 9 to be emitted is suppressed so that a rise in temperature of the aperture arrays 3 and 5 is suppressed, and thermal expansion can be suppressed. For this reason, the patterns can be formed accurately. One hundred of the aperture sections 8 is a number which can be achieved sufficiently in the production technical field and in the technical field of voltage control for the electrodes 10. Here, the above second aperture array is composed of square lattices arranged on 10 lines×10 rows. However, for example, a number of the lies and a number of the rows may be set arbitrary such as 20 lines×15 rows. The arrangement of the aperture sections of the second aperture array may be set arbitrarily according to the basic figures.

Figure 6:
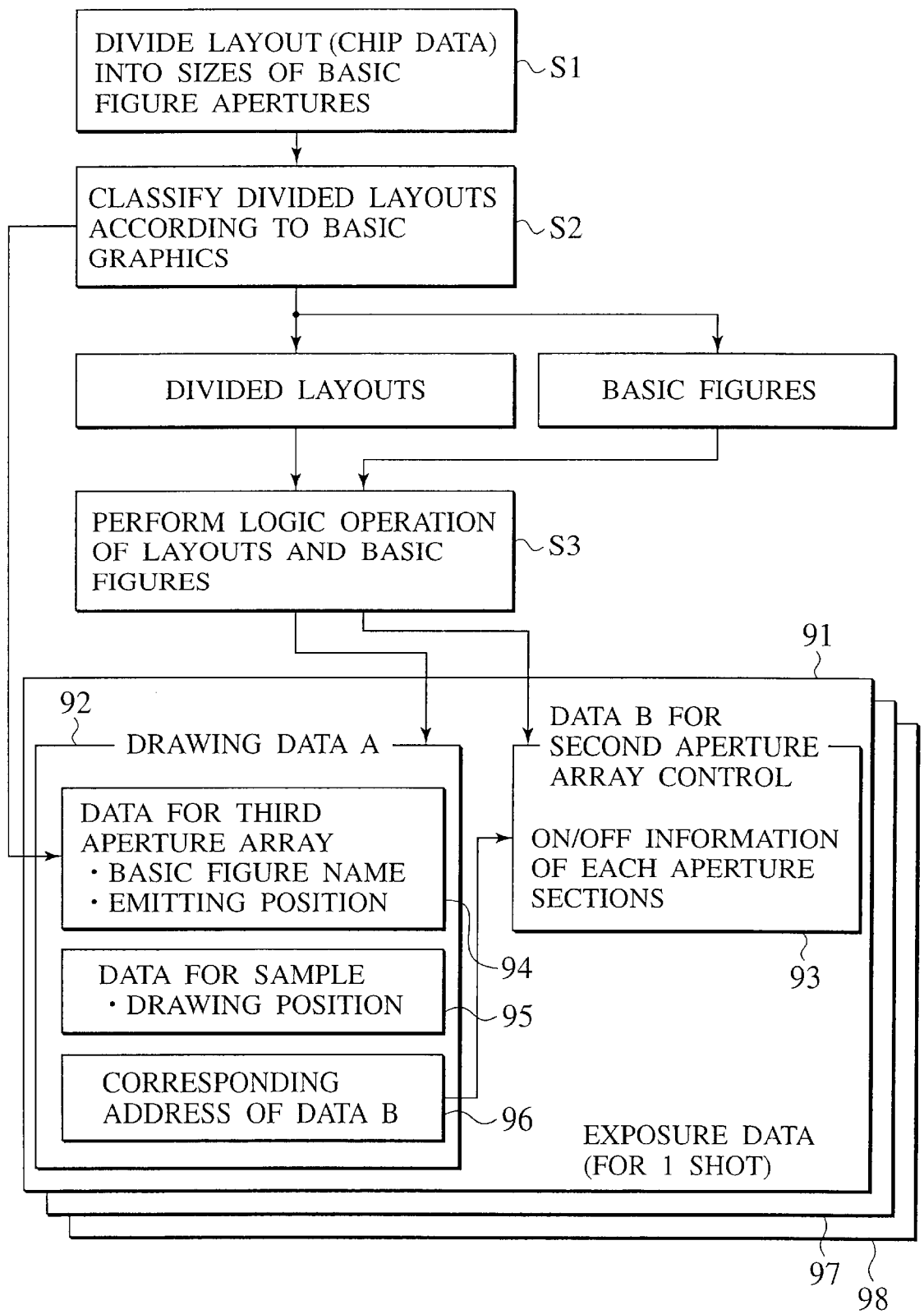
FIG. 6 is a flow chart showing an exposure data creating method according to the first embodiment.

There will be explained below an exposure method by the above-described exposure apparatus. At first, layout data of the semiconductor apparatus are converted into exposure data which are applicable to the exposure apparatus. FIG. 6 is a flow chart showing an exposure data creating method according to the first embodiment.

In the exposure data creating method according to the first embodiment, at step S1 layout data of the semiconductor apparatus are divided into a size of the basic figure aperture A1 or the like which takes reduction in exposure into consideration.

At step S2 the divided layouts are classified as the basic figure aperture A1 or the like.

At step S3 a portion where the divided layouts and the classified basic figure aperture A1 or the like are overlapped with each other is obtained by logic operation.

Further, the data 93 for second aperture array control, which are on/off information about deflection due to the electrodes 10 of the second aperture array 3, are created based on the overlapped portion.

Finally, drawing data 92 are created. The drawing data 92 have the data 95 for sample including a drawing position of the sample 7 as a position of the divided layouts in the layout of the semiconductor apparatus. Moreover, the drawing data 92 have the data 94 for the third aperture array which include a name of the classified basic figure aperture and if necessary an emitting position of the beam onto the basic figure aperture. The drawing data 92 have an address 96 for being capable of reading the data 93 for the second aperture array control. For this reason, the data 93 have correspondence to the data 92. Moreover, the data 94 and 95 and the address 96 have correspondence to each shot of the electron beam 9 for exposed. The drawing data 92 and the data 93 for the second aperture array control compose exposure data 91 for one shot. The exposure data 91 as well as a plurality of exposure data 97 and 98 having the same structure as the data 91 compose the exposure data (whole) of the semiconductor apparatus.

Here, "the basic figure aperture" is an iris which is cut into the shape of the basic figure. The "position of the divided layouts in the layout of the semiconductor apparatus" is information which can reproduce the whole layout of the semiconductor apparatus by rearranging is obtained by rearranging the divided layouts. "Taking reduction in exposure into consideration" means that portions which are deformed due to the reduction are corrected so as to have correspondence to one another. "The name of the basic figure" is a tag which can identify the basic figure from a plurality of the basic figures. As a result, since data showing forms of the basic figures may not be provided, an amount of data can be reduced, and a generating speed of the exposure data and a processing speed of exposure can be improved. In "the address 96 for being capable of reading the data 93 for the second aperture array control ", the data 93 for the second aperture array control have correspondence to the position via the address 96.

The exposure data creating method according to the first embodiment comprising the steps of:
  dividing chip data into a CP size;
  classifying the divided CP patterns as the basic figure A1 or the like in library;
  performing logic operation of the basic figure A1 or the like and the CP patterns and obtaining an overlapped portion;
  creating data B for beam on/off on the second aperture array 3; and
  creating drawing data A including position data of the CP patterns on the third aperture array 5, which are paired with the basic figure A1 or the like.

Here, the "CP size" is a range in which exposure can be carried out by one shot of the beam emission. The "CP pattern" is a pattern which is divided based on the range. "In library" means to prepare things for use object.

The "logic operation of the basic figure and the CP patterns" is calculation which is carried out for each position of the area including the basic figure and the CP patterns in a state that the basic figure is overlapped with the CP patterns. In the logic operation, when both the basic figure and the CP patterns exist, 1 is put, and when not exist, 0 is put. As a result, since the forms of the basic figures should not be provided as data, an amount of data can be reduced, and the creating speed of the exposure data and the processing speed of the exposure can be improved.

The exposure data 91 of the first embodiment has the data 93 for the second aperture array control showing on/off of the deflection of the aperture sections 8 on the second aperture array 3.

The exposure data 91 has the drawing data 92. The drawing data 92 includes:
  the data 95 for sample of a drawing positions of the divided layouts in the layout of the semiconductor apparatus;
  the data 94 for the third aperture array of the name of the classified basic figure; and
  the address 96 for being capable of reading the first data.

The data 95 and the data 94 and the address 96 have correspondence to one another.

Such exposure data are recorded on a recording medium which is capable of being read by a computer. Here, the "recording medium" includes media, which is capable of recording programs thereinto, such as a semiconductor memory, a magnetic disc, an optical disc and a magnetic tape. In order to prevent the data size from being enlarged, data showing the form of the basic figure A1 or the like can be omitted. Therefore, as for the pattern data whose file size is reduced by this method, design data can be downloaded or uploaded for short time by using a network such as internet. As a result, an order from the outside a company and a process on the outside a company which have been difficult can be carried out comparatively easily.

A program for creating the exposure data according to the first embodiment has:
  the procedure for dividing the layout data of the semiconductor apparatus into a size of the basic figure aperture A1 or the like which takes reduction in the exposure into consideration; and
  the procedure for classifying the divided layouts as the basic figure aperture A1 or the like.

Further, the program for creating the exposure data has:
  the procedure for obtaining an overlapped portion of the divided layouts and the classified basic figure aperture A1 or the like; and
  the procedure for creating the data 93 for the second aperture array control showing existence/non-existence of the deflection of the aperture sections 8 on the second aperture array 3.

Further, the program for creating the exposure data has the procedure for creating the drawing data 92 having:
  the data 95 for sample showing a drawing position of the divided layouts in the layout of the semiconductor apparatus;
  the data 94 for the third aperture array of the name of the classified basic figure; and
  the address 96 for being capable of reading first data, wherein the position 95, the name 94 and the address 96 have correspondence to one another.

The program for creating the exposure data is stored in a recording medium which can be read by a computer. As a result, the exposure data can be created easily and automatically by the computer.

The exposure data creating method according to the first embodiment will be explained more specifically.

Figure 8A:
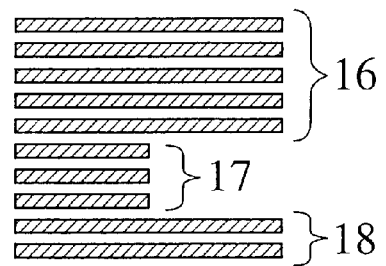
FIGS. 8A to 9B are diagrams for explaining the steps in the exposure data creating method according to the first embodiment.

(1) At step S1 of FIG. 6, the data of the layout in the semiconductor apparatus (chip data) are divided into sizes of the basic figure apertures A1 to A5, B1 to B5 and C taking reduction exposure into consideration. The divided layout for 1 block is shown in FIG. 8A. This layout is composed of layout patterns 16, 17 and 18 of the wirings arranged in the horizontal direction. A length of the pattern 17 is shorter.

Figure 8B:
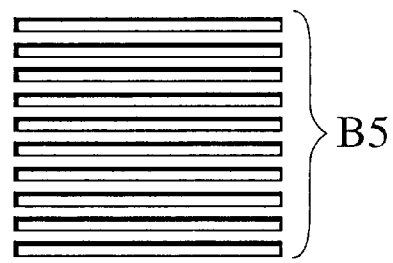

(2) At step S2 of FIG. 6 the divided layouts are classified according to the basic figures. The layout of FIG. 8A is for the wirings which are arranged in the horizontal direction and the outline of the layout is rectangular. For this reason, the basic figure B5 shown in FIG. 8B is selected from the basic figures of FIG. 4A.

(3) At step S3 the logic operation is performed by the selected basic figure B5 corresponding to the divided layout (FIG. 8A) so that the overlapped portion is obtained. The data 93 for the second aperture array control (data B for beam on/off) of the aperture sections 8 on the second aperture array 3 are created. The created data 93 are recorded on the optical data recording means 88 in FIG. 1.

Figure 8C:
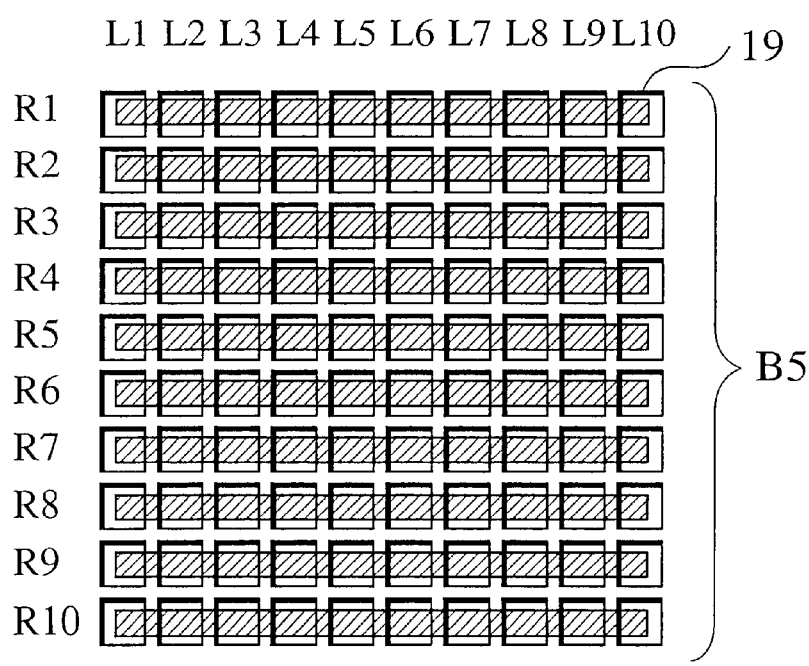
Figure 9A:
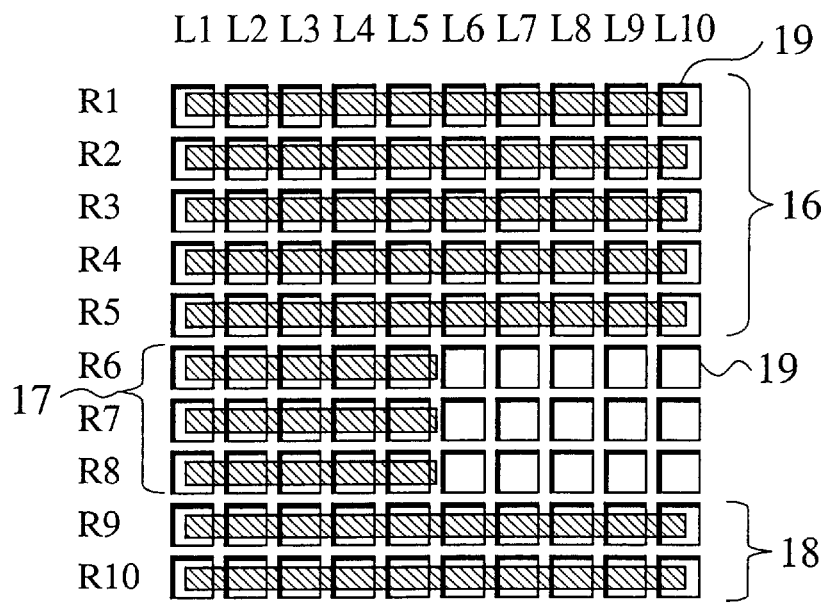
Figure 9B:
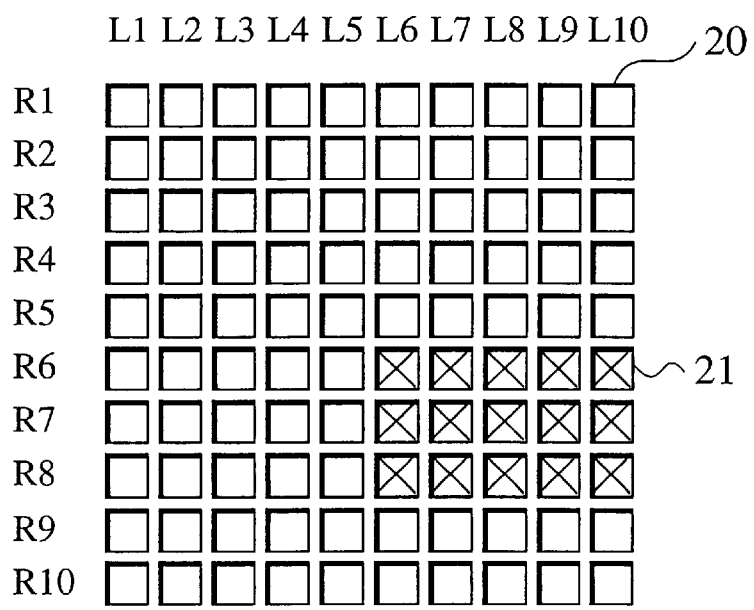

A coordinate system which is composed of coordinate units 19 in the arrangement position having the same lines and rows as the aperture sections 8 on the second aperture array 3, is prepared. As shown in FIG. 8C, when the basic FIG. 5B is overlapped on the coordinate system, the FIG. 5B is arranged on all the coordinate units 19. Similarly as shown in FIG. 9A, the layouts 16 to 18 are overlapped on the coordinate system. No layout is arranged in the range of the lines 6 to 10 and the rows 6 to 8. As a result, the overlapped portion becomes display data 20 which shows "no deflection" shown by "□" in FIG. 9B. The non-overlapped portion becomes display data 21 which shows "deflection" shown by "×". The display data 20 and 21 for each coordinate (L, R) are the data B for beam on/off (93).

(4) Meanwhile, the drawing data A (92) are created. The drawing data A (92) are composed of a drawing position on the sample 7 (arrangement position of the divided layouts (FIG. 8A) in the whole layout of the semiconductor apparatus, namely, corresponding to the data 95), the basic figure name (corresponding to the data 94) according to the drawing position, and the address 96 for being capable of reading the data B (93) according to the drawing position. Here, the basic figure name according to the drawing position (corresponding to the data 94) is not limited to this, namely, and basic figure B5 or the like may be identified. Namely, the arrangement position on the third aperture array 5 and allocated identification number may be used. Moreover, the created data 92 are recorded on the exposure data recording means 88 of FIG. 1.

The sequence returns to step S1 of FIG. 6 in (1) so that the exposure data 97 and 98 are created similarly until the divided layouts for 1 block do not exist.

Figure 7:
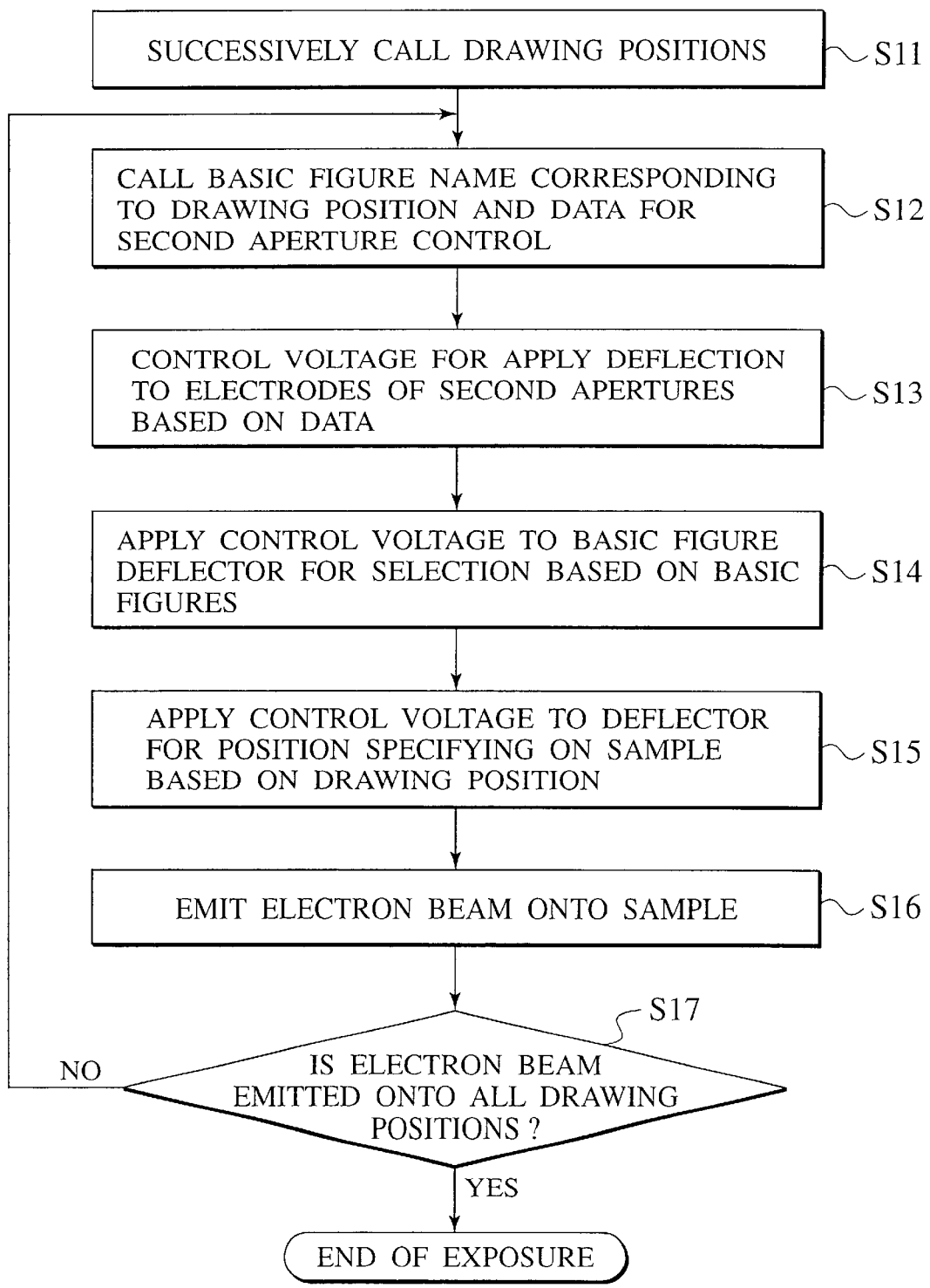
FIG. 7 is a flow chart showing an exposure method according to the first embodiment.

There will be explained below the latter half of the exposure method using the semiconductor apparatus using the created exposure data 91. FIG. 7 is a flow chart showing the exposure method according to the first embodiment.

(5) At step S11 the central control device 82 calls the drawing positions 95 of the drawing data A (92) for the exposure data 91, 97 and 98 from the exposure data recording means 88. First, the case of the exposure data 91 will be explained below.

(6) Next, at step S12 the central control device 82 calls the name of the basic figure B5 as the basic figure name 94 corresponding to the called drawing position 95 from the exposure data recording means 88. The name of the basic figure B5 is input into the first deflector control means 84.

Figure 10A:
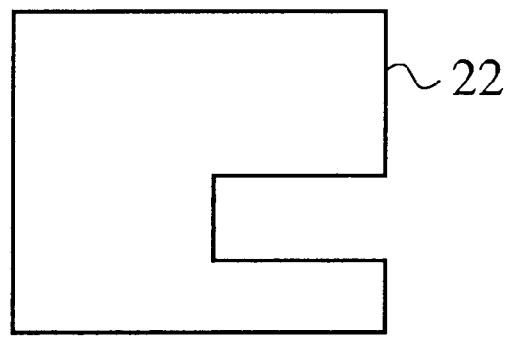
FIGS. 10A to 10C are diagrams for explaining the steps of the exposure method according to the first embodiment.

In addition, the central control device 82 calls the address 96 for being capable of reading the data B (93) corresponding to the called drawing position 95. The central control device 82 calls the data B (93) based on the addresses 96 and inputs the data B to the second aperture control means 83. The called data B (93) are the data explained with reference to FIG. 9B. As for the data 93, the display data 20 showing non-deflection are simplified and are shown in FIG. 10A as distribution 22 of the aperture sections 8 of non-deflection.

(7) At step S13 the second aperture array control means 83 applies control voltage V for a deflection to the electrodes 10 of the second aperture array 3 based on the input data B (93).

Figure 10B:
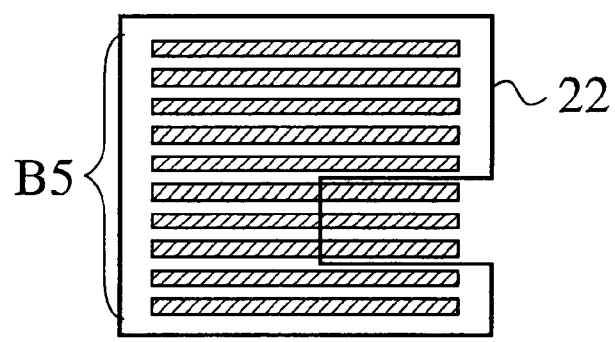
Figure 10C:
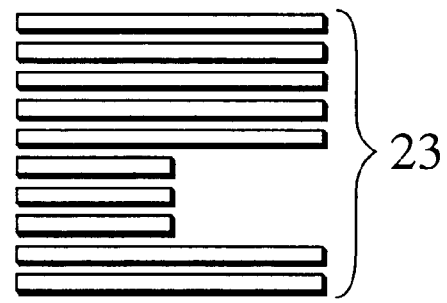

(8) At step S14 the first deflector control means 84 applies a control voltage to the first deflector 4 based on the input basic figure name. The control voltage is applied to the deflector 4 so that the electron beam 9 is led to the basic figure B5 in the array 5 of FIG. 4 based on the name of the basic figure B5 of the input data A. As a result, as shown in FIG. 10B, a mask due to the distribution 22 of the aperture sections 8 which do not deflect the electron beam 9 to its advancing path, and a mask due to the basic figure B5 are arranged. The electron beam 9 passing through both the masks has a form 23 shown in FIG. 10C. The form 23 coincides with the forms 16, 17 and 18 of FIG. 8A.

(9) At step S15 the second deflector control means 86 inputs the drawing position 95 called into the central control device 82. The second deflector control means 86 applies a control voltage to the second deflector 6 to be a deflector for position specifying based on the called drawing position 95.

(10) At step S16 the central control device 82 instructs the electron gun control means 81 to emit the electron beam 9 from the electron gun 1 to the first aperture 2. Here, the control voltages should be applied at steps S13 to S15 also when the electron beam 9 is emitted. An amount of the emitted electron beam 9 is sufficient for the exposure of the data A shaped into the form 23 shown in FIG. 10C to the drawing position 95.

The emission of the beam 9 is stopped, and the application of the control voltages to the second aperture array 3 and the first and second deflectors 4 and 6 is stopped. More specifically, the beam 9 is emitted or is not emitted by a beam blanker 76, shown in FIG. 1B.

(11) At step S17 a judgment is made as to whether or not the electron beam 9 is emitted to all drawing positions of the data A. Since the electron beam 9 is not emitted to the drawing positions 94 of the exposure data 97 and 98 in FIG. 6, the sequence returns to step S12 so that the steps S12 to S16 are executed for the drawing positions. After the execution, when the drawing position to which the beam is not emitted does not exist, the exposure method is ended. In the case where the chip is larger than the beam deflection area of the exposure apparatus, the sample stand 73 having the driving means on which the sample 7 is placed moves. This movement is carried out at the time of executing the step S15 or instead of the execution of the step S15. Namely, the sample stand driving control means 87 inputs the called drawing position 95 to the central control device 82. The sample stand driving control means 87 moves the sample stand 73 based on the called drawing position 95.

Namely, in the case of the patterns 16 to 18 shown in FIG. 8A, these patterns 16 to 18 are created as CP apertures in the conventional method. In the first embodiment, the basic figure aperture B5 having a line and space pattern shown in FIG. 8B is prepared. The beam shape shown in FIG. 10A is formed on the second aperture array 3, and the beam is emitted onto the apertures B5 shown in FIG. 8B. As a result, the pattern having the same form as FIG. 8A can be obtained as the exposure pattern 23 of FIG. 10C.

Various patterns can be drawn by changing the form of the beam which is not deflected on the second aperture array 3 based on the basic figures on the third aperture array 5. Moreover, the exposure (drawing) data are divided into the data A (92) and B (93) so that the data can be compressed.

(Second Embodiment)

Figure 11:
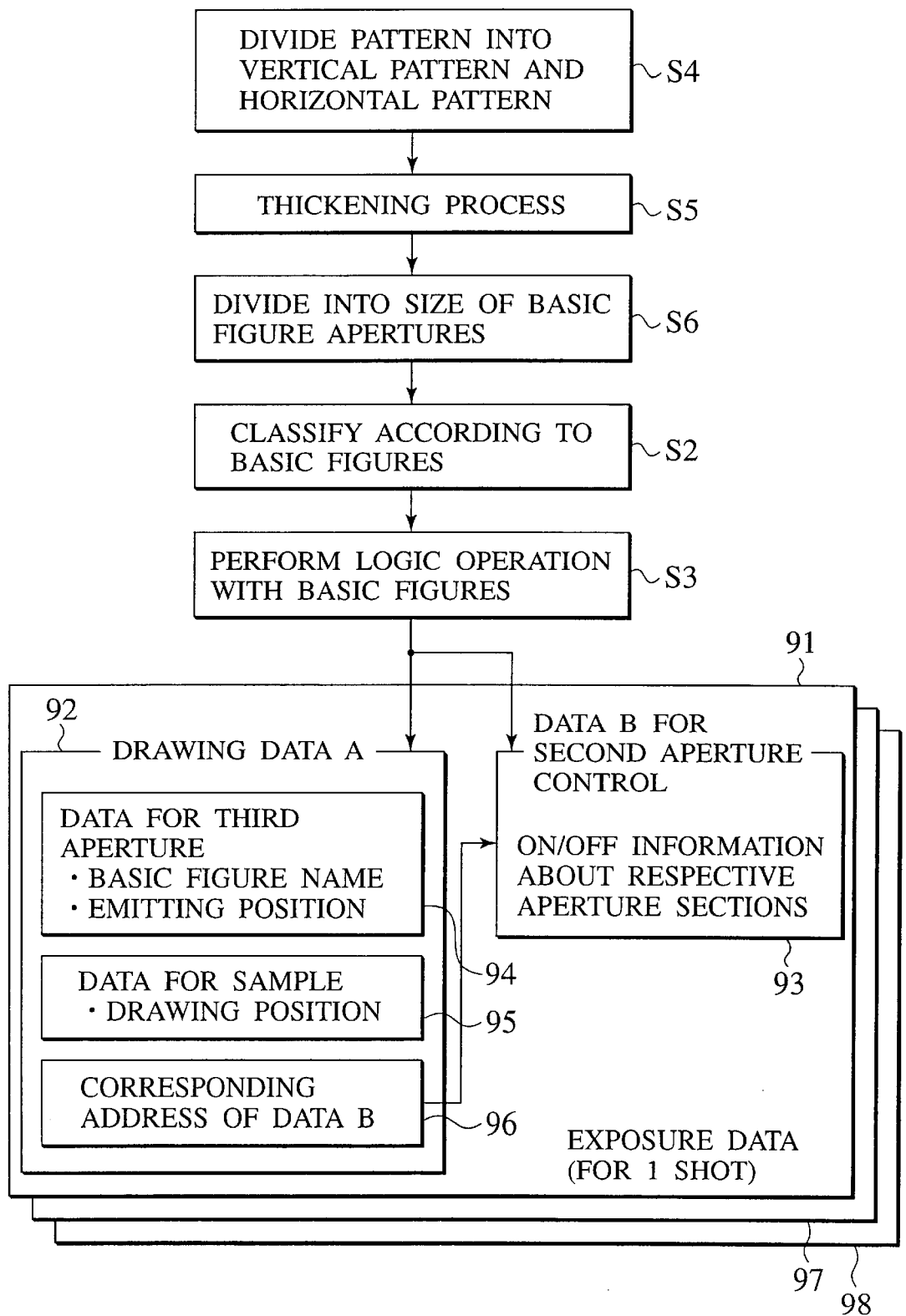
FIG. 11 is a flow chart showing the exposure data creating method according to the second embodiment.

Next, there will be explained below the creating method according to the second embodiment which is obtained by developing the exposure data creating method explained in the first embodiment. Moreover, there will be explained below the exposure method according to the second embodiment using the developed creating method. FIG. 11 is a flow chart showing the exposure data creating method according to the second embodiment.

In the exposure data creating method according to the second embodiment, at step S4 data of the layout in the semiconductor apparatus are divided into a vertical line pattern and a horizontal line pattern which take reduction in the exposure into consideration.

Next, at step S5 widths of the vertical line patterns are enlarged so that a first pattern, in which the adjacent vertical line patterns are integrated, is created. Further, widths of the horizontal line patterns are enlarged so that a second pattern, in which the adjacent horizontal line patterns are integrated, is created.

At step S6 the first and second patterns are divided into the sizes of the basic figure apertures which take reduction in the exposure into consideration.

At step S2 similarly to the case of FIG. 6, the divided first and second patterns are classified according to the basic figure apertures.

At step S3 similarly to the case of FIG. 6, the overlapped portions of the divided first and second patterns and the classified basic figure apertures are obtained. The data 93 for the second aperture array control showing existence/non-existence of deflection at each aperture section on the aperture array are created. Moreover similarly to the first embodiment, the drawing data 92 are created. A wiring pattern which is obtained by combining the wirings in the vertical direction and the wirings in the horizontal direction can be formed by the exposure data creating method according to the second embodiment.

There will be explained below in detail the exposure data creating method according to the second embodiment.

Figure 12:
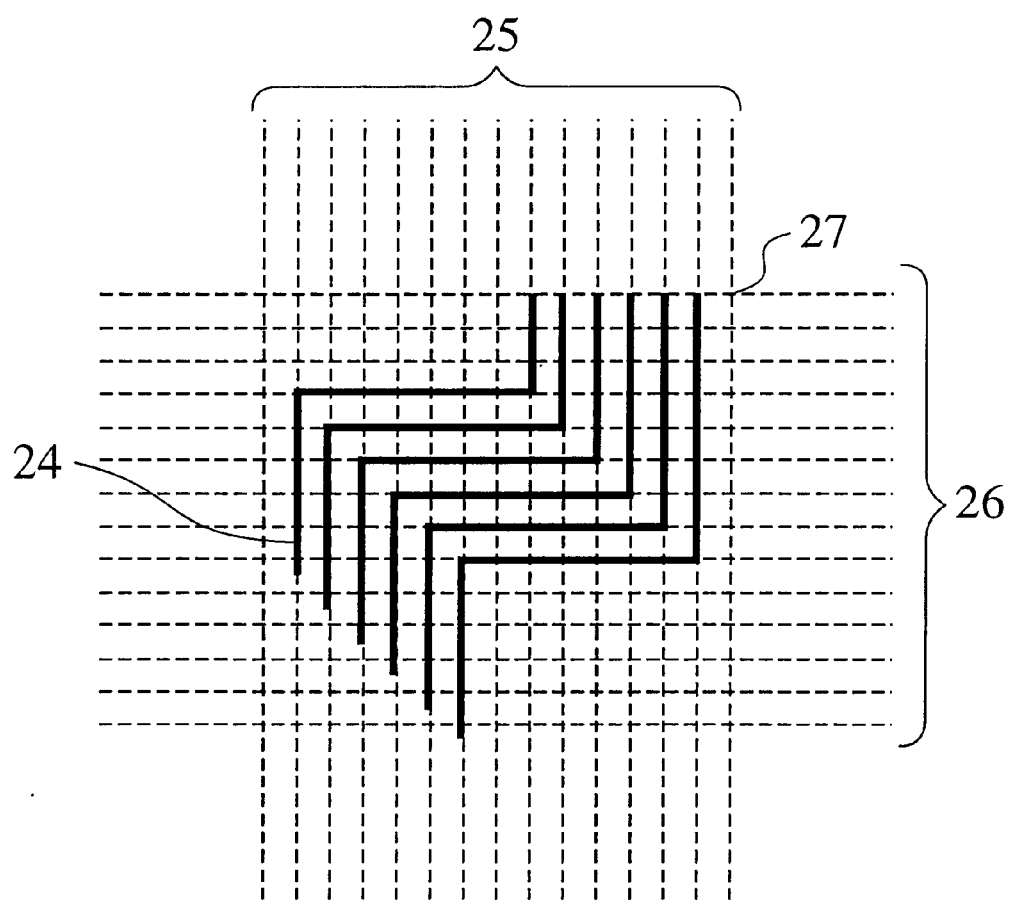
FIGS. 12 to 16B are diagrams for explaining the steps in the exposure data creating method according to the second embodiment.
Figure 13A:
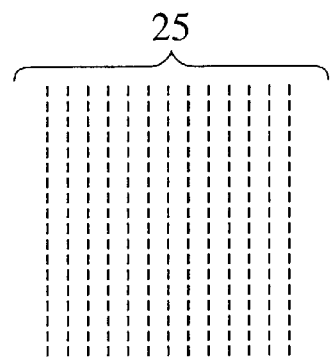
Figure 13B:
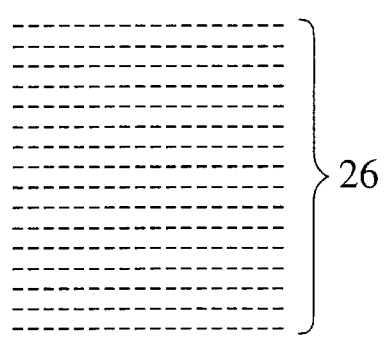
Figure 13C:
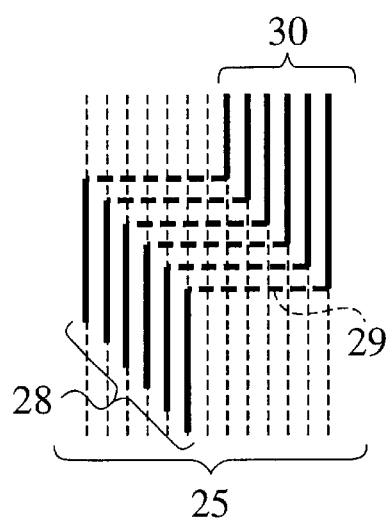
Figure 13D:
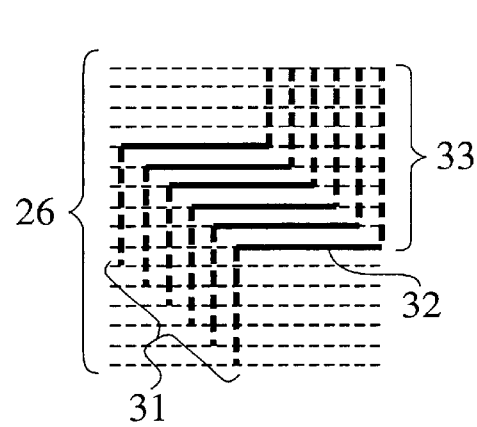
Figure 13E:
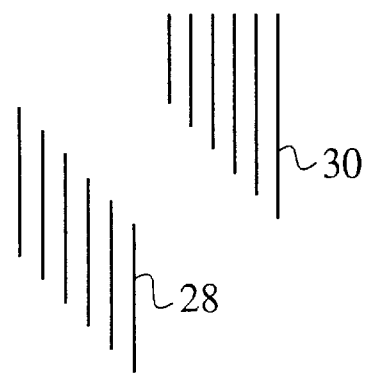
Figure 13F:
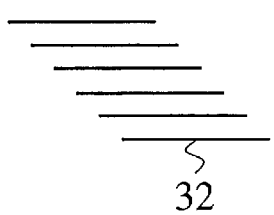

(1) At step S4 the pattern in the chip data is divided into vertical component patterns and horizontal component patterns. As shown in FIG. 12, the wiring patterns 24 are arranged so as to connect lattice points 27 on vertical dotted lines 25 and the horizontal dotted lines 26, and are composed of vertical and horizontal straight lines and intersection points. The lattice points 27 are intersection points of the vertical dotted lines 25 and the horizontal dotted lines 26. The vertical and horizontal pitches of the lattice points 27 are 0.2 μm. This pitch corresponds to the pitch of the wirings. The following method is used to divide the wiring patterns 24 into vertical and horizontal component patterns. The logic operation of the vertical dotted lines 25 shown in FIG. 13A and the horizontal dotted lines 26 shown in FIG. 13B is performed for the wiring patterns 24 so that overlapped portions of the patterns 24 and the dotted lines 25 and 26 are obtained. The portions shown by thick solid lines in FIG. 13C are the overlapped portions 28 and 30 of the vertical dotted lines 25 and the patterns 24. The thick horizontal dotted lines 29 are the patterns 24 which are not overlapped with the vertical dotted lines 25. Moreover, the portions 32 shown by the thick solid lines in FIG. 13D are the overlapped portions of the horizontal dotted lines 26 and the patterns 24. The thick vertical dotted lines 31 and 33 are the patterns 24 which are not overlapped with the horizontal dotted lines 26. As shown in FIGS. 13E and 13F, the thick solid lines 28, 30 and 32 which are the overlapped portions are extracted so as to be divided into three patterns 28, 30 and 32.

Figure 14A:
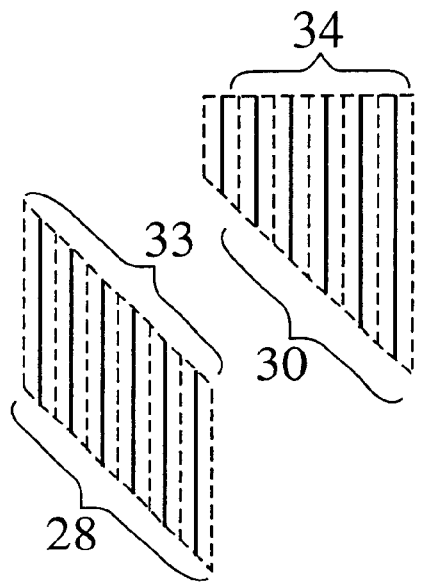
Figure 14B:
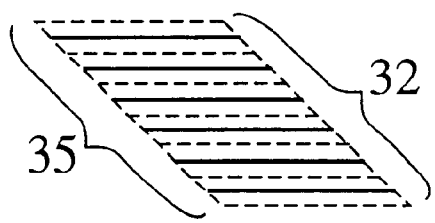
Figure 14C:
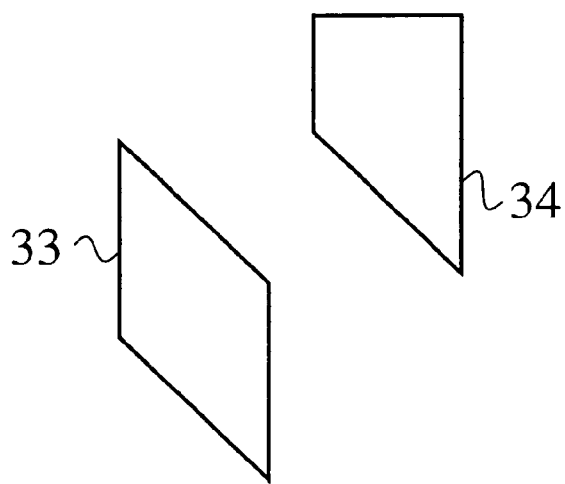
Figure 14D:
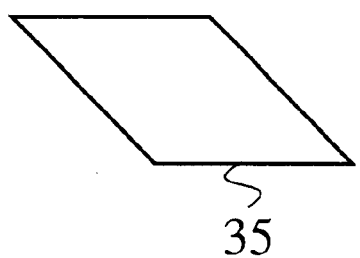

(2) Next, at step S5 the patterns 28, 30 and 32 are subject to a thickening process. As shown in FIGS. 14A and 14B, the divided patterns 28, 30 and 32 are subject to the thickening process. At this time, a thickening amount is set to the same value as the value obtained by subtracting the wiring width (: 0.1 μm) from the lattice point pitch of the wiring patterns 24. Both sides of the patterns 28, 30 and 32 are thickened by the same amount, i.e., 0.05 μm (total: 0.1 μm). According to this thickening process, as shown in FIGS. 14C and 14D, the wiring patterns 28, 30 and 32 are converted into patterns 33, 34 and 35 having polygonal form.

Figure 15A:
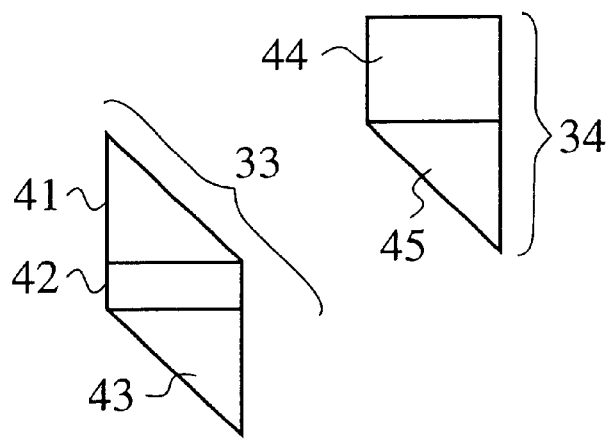
Figure 15B:
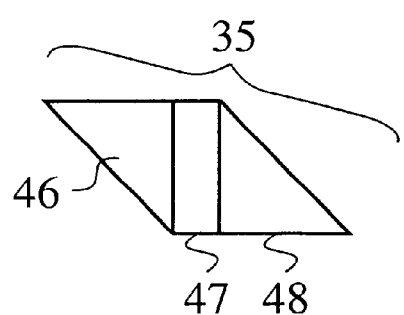

(3) At step S6 the patterns 33, 34 and 35 which were subject to the thickening process are divided into sizes of the basic figure apertures A1 or the like. Here, the thickened polygonal patterns 33, 34 and 35 are divided into triangle and rectangle. The vertical component patterns are divided in the horizontal direction, and the horizontal component patterns are divided in the horizontal direction. As shown in FIGS. 15A and 15B, the thickened polygonal patterns 33 to 35 are divided into rectangles 42, 44 and 47 and triangles 41, 43, 45, 46 and 48. The wiring patterns 33 and 34 in the vertical direction are divided in the horizontal direction, and the wiring pattern 35 in the horizontal direction is divided in the vertical direction.

Figure 15C:
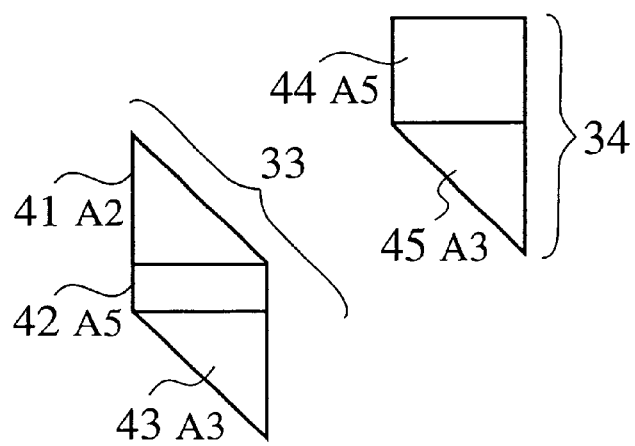
Figure 15D:
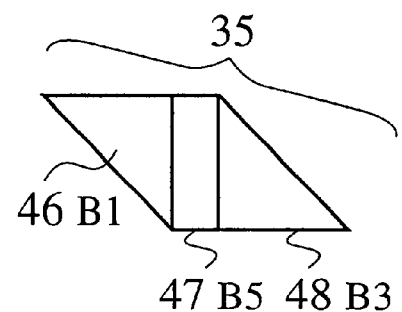

(4) At step S2 the divided patterns are classified according to the basic figures A1 to A5 and B1 to B5 in the library shown in FIG. 4. The classification of the divided wiring patterns 41 to 45 in the vertical direction will be explained. At first, the wiring patterns 41 to 45 are pattern-matched with the basic figures A1 to A5 shown in FIG. 4. For example, as shown in FIG. 15C, the rectangular patterns 42 and 44 are classified as the basic figure A5. Moreover, the triangular patterns 43 and 45 are classified as the triangular basic figure A3, and the triangular pattern 41 is classified as the triangular basic figure A2. Similarly, the wiring patterns 46 to 48 in the horizontal direction are pattern-matched with the basic figures B1 to B5, and as shown in FIG. 15D, the rectangular pattern 47 is classified as the basic figure B5. The triangular pattern 46 is classified as the triangular basic figure B1, and the triangular pattern 48 is classified as the triangular basic figure B3.

Figure 16A:
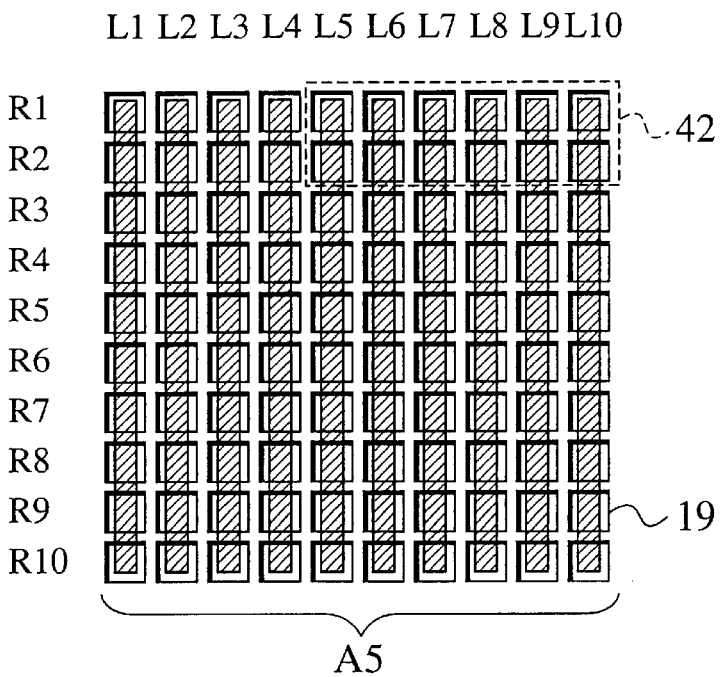

(5) At step S3 the logic operation of the classified basic figures and the divided rectangular and triangular wiring patterns is performed so that overlapped portions are obtained. The data B for beam on/off (93) of the second aperture array 3 are created. For example as shown in FIG. 16A, the rectangular pattern 42 has an overlapped portion in the range of lines L5 to L10 and the lows R1 to R2 with respect to the basic figure A5. Therefore, as for the data B (93) relating to the rectangular pattern 42, the display data showing non-deflection are set in the range of lines L5 to L10 and the rows of R1 and R2, and the display data showing deflection are set in the range of the lines L1 through 4 and rows R1 and R2 and the range of lines L1 to L10 and rows R3 to R10. Here, as to where in the basic figure A5 to overlap the pattern 42, this is not limited to the case where the pattern 42 is arranged on the upper-right end position shown in FIG. 16A. Therefore, the pattern 42 may be arranged so as to be overlapped on the coordinate units 19 of line L1 and row R1, line L1 and row R10, line L10 and row R10, or the pattern 42 may be arranged under only the condition that it is overlapped any position.

Figure 16B:
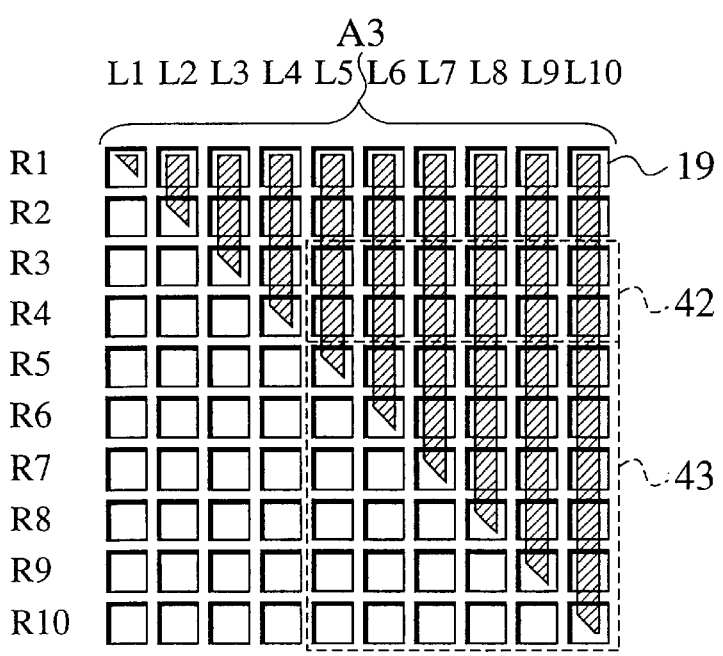

In addition, as shown in FIG. 16B, the triangular pattern 43 has an overlapped portion in the range of lines L5 to L10 and rows R5 to R10 on the basic figure A3. Therefore, as the data B (93) relating to the triangular pattern 43, the display data showing non-deflection are set in the range of lines L5 to L10 and rows R5 to R10, and the display data showing deflection are set in the range of lines L1 to L10 and rows R1 to R4 and the range of lines L1 to L4 and rows R5 to R10. Here, when the patterns 42 and 43 which created the data B (93) explained with reference to FIGS. 16A and 16B are the patterns 42 and 43 in the area 33 of FIG. 15C, the patterns 42 and 43 are combined with each other so as to be capable of being overlapped in the range of lines L5 to L10 and rows R3 to R10 in FIG. 16B. In such a manner, one shot of the electron beam can be emitted instead of the case where two shots of the electron beams should be emitted.

(6) Meanwhile, the drawing data A (92) are composed of the drawing positions 95 on the sample 7 (the arrangement positions of the divided layouts in the whole layout of the semiconductor apparatus), the basic figure names 95 classified at S2 according to the drawing positions 95, and the addresses 96 for being capable of reading the data B (93) set at step S3 according to the drawing positions 95. In such a manner, the exposure data 91, 97 and 98 are created as the drawing data A (92) and the data B for the second aperture array control (93).

Figure 17:
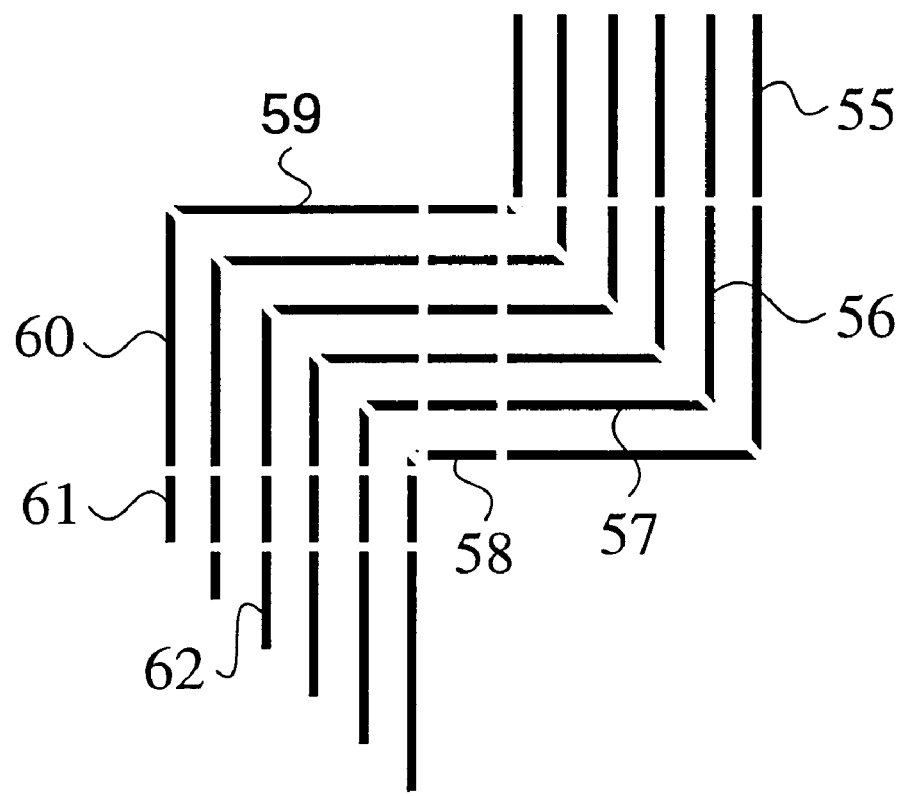
FIG. 17 is a diagram for explaining the step in the exposure method according to the second embodiment.

Next, the semiconductor apparatus is exposed based on the exposure data 91, 97 and 98. This exposure method is performed based on the flow chart in FIG. 7 similarly to the first embodiment. At the time of the exposure, the drawing data A (92) and the data B for the second aperture array control (93) are used. These data 92 and 93 act upon the electron beam exposure apparatus shown in FIG. 1 as follows. The data B for beam on/off (93) of the second aperture array 3 directly act upon the second aperture array 3 so as to actuate the deflectors 10 for aperture sections 8 on the second aperture array 3. As a result, the electron beam 9 having arbitrary form is emitted onto the third aperture array 5. The drawing data A (92) control the first deflector 4 and is used when the basic figure aperture A1 or the like is selected. Simultaneously, the drawing data A (92) control the second deflector 6 and the sample stand 73 and can carry out electron beam exposure on an arbitrary position of the sample 7. As a result, as shown in FIG. 17, synthesized images 55 to 62 of the second aperture array 3 and the third aperture array 5 are transferred onto the sample 7. As a result, the exposure of the wiring patterns 24 shown in FIG. 12 can be executed.

(Third Embodiment)

The third embodiment will explain the case where LSI type patterns are used as the basic figures of the basic figure apertures.

Figure 18A:
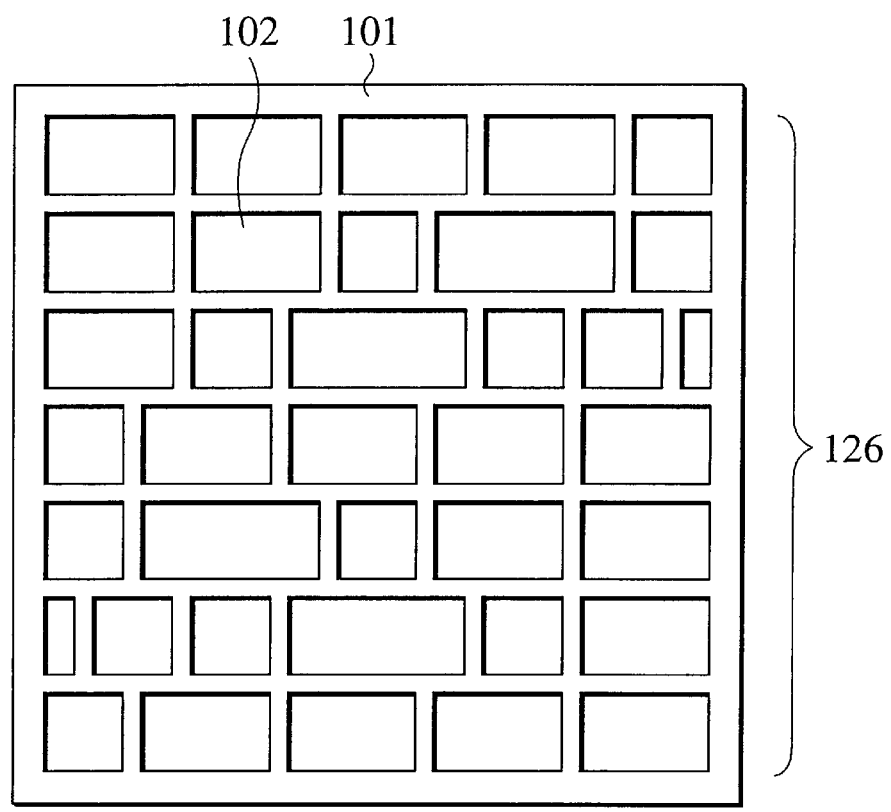
FIGS. 18A and 18B are upper surface diagrams of the third aperture array (basic figure aperture array) according to the third embodiment.

In the third embodiment, the exposure apparatus used in the first embodiment is used. The characteristic of the third embodiment is that a lot of LSI type patterns 126 are arranged on the third aperture array (basic figure aperture array) 101 as shown in FIG. 18A. Here, the LSI type patterns 126 are patterns of parts composing an LSI circuit. The LSI chip is designed so that several hundred kinds of standard cell (SC) patterns are combined according to applications and are arranged. The third embodiment will explain the case where the SC patterns are the type patterns, namely, the basic figure patterns 126.

Figure 18B:
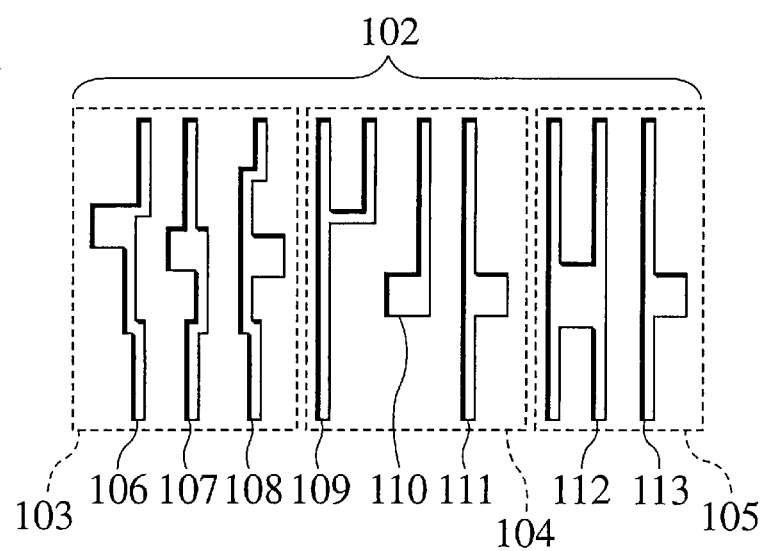

SC patterns 103 to 105 shown in FIG. 18B are arranged on one basic figure pattern 102 in the plural basic figure patterns 126. FIG. 18B is one example, and a plurality of SC patterns having different forms (functions) are arranged in the basic figure patterns 126. The SC pattern 103 has patterns 106 to 108 such as gate electrode layer or the like. The SC pattern 104 has patterns 109 to 111. The SC pattern 105 has patterns 112 and 113. The SC patterns 103 to 105 compose SCs (units of SC patterns) having respective simple functions. The basic figure pattern 102 where the SC patterns 103 to 105 are connected also composes SCs having more complicated function.

Figure 19:
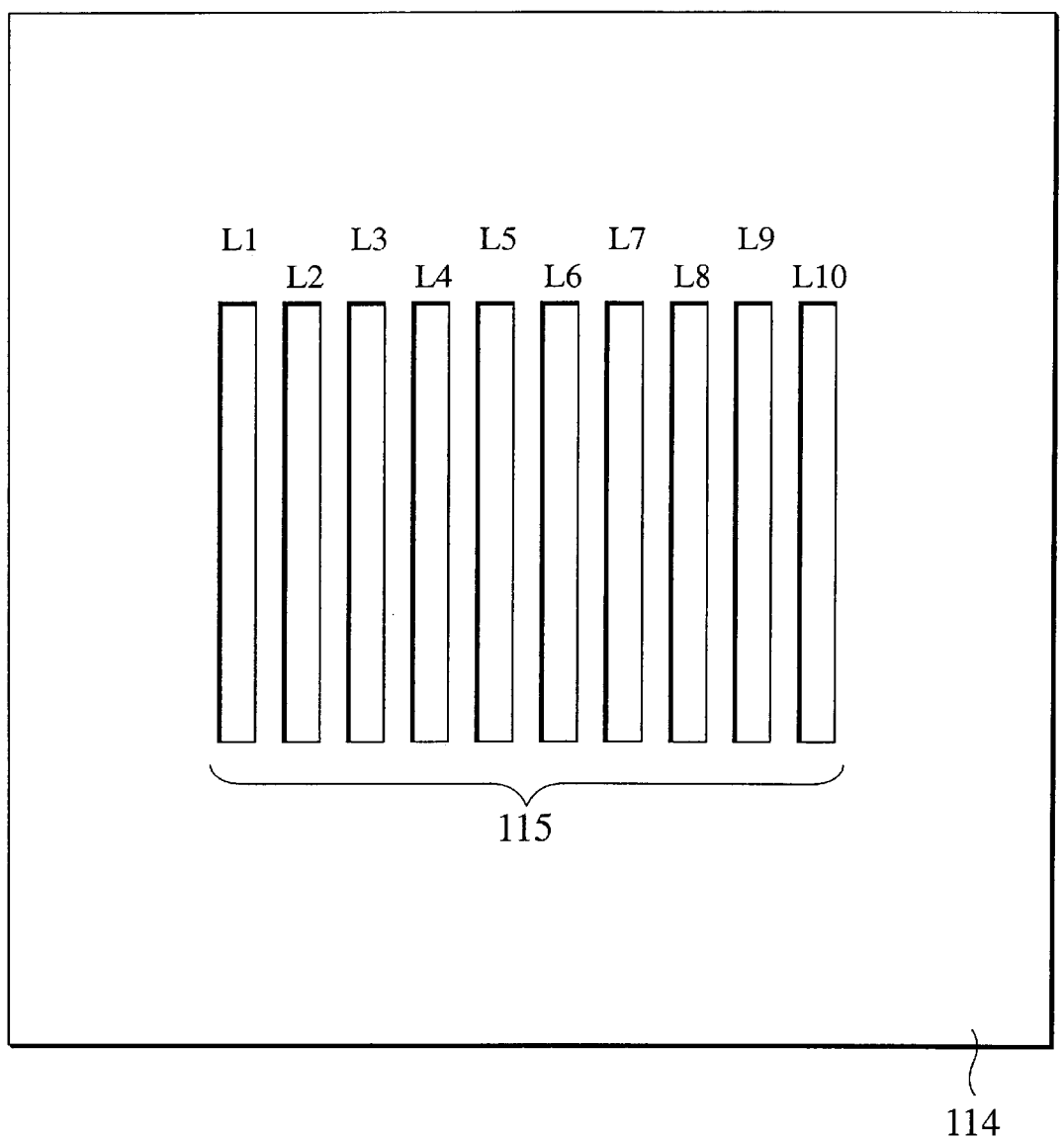
FIG. 19 is an upper surface diagram of the second aperture array (blanking aperture array) according to the third embodiment.

In the third embodiment, a second aperture array 114 shown in FIG. 19 can be used. The second aperture array 114 is also a blanking aperture array. The second aperture array 114 has aperture sections 115 having electrodes 10 being capable of deflecting the electron beam 9. The ten aperture sections 115 are arranged in the horizontal direction, on lines L1 to L10. Needless to say, the second aperture array 3 shown in FIG. 2 used in the first embodiment may be also used. The array 114 whose length cannot be adjusted in the vertical direction can be used because the design is normal so that the vertical lengths of SCs become uniform.

Next, there will be explained below the exposure method according to the third embodiment. A Pattern 116 shown in FIG. 20A, for example, is exposed. The pattern 116 is composed of patterns 117 through 122 and 138.

First, similarly to the first embodiment, according to FIG. 6, the exposure data are created. However, in the third embodiment, the step S1 and the step S2 are executed simultaneously. For example, the pattern 118 is selected, and the same pattern is retrieved from the basic figure pattern 126. As a result, the pattern 107 of FIG. 18B is detected. With this retrieval, the pattern 107 except for the SC pattern 103 (102) may be occasionally detected. Next, the pattern 108 which is the same as the pattern 119 adjacent to the pattern 118 detects the pattern 103 (102) which is adjacent to the previously detected pattern 107. The above steps are repeated so that the pattern 102, which has the same patterns 107 to 111 as the patterns 118 through 122, can be detected.

Further, a judgment is made as to whether or not the same pattern as the pattern 138 exists on the right side of the pattern 111 in the pattern 102. Since not the pattern 138 but the pattern 112 exists on the right side of the pattern 111, the judgment is made that the same pattern as the pattern 138 does not exist on the right side of the pattern 111 in the pattern 102.

Similarly, a judgment is made as to whether or not the same pattern as the 117 on the left side of the pattern 118 exists on the left side of the 107. In such a manner, the same patterns as the patterns 117 to 122 can be found from the patterns 106 to 111 in the pattern 102. This finding process corresponds to classification of the layout 116 at step S1 of FIG. 6 according to the patterns 117 to 122 and the pattern 138. Moreover, this finding procedure simultaneously corresponds to classification of the divided layouts 117 to 122 at step S2 according to the basic FIG. 102 having the patterns 106 to 111.

The steps S1 and S2 are executed so that the drawing data 92 can be created. The basic figure names of the data 94 for the third aperture array of the drawing data 92 become identification symbol of the pattern 102. The emitting positions are the patterns 106 to 111. Moreover, the drawing position of the data 95 for sample is the arrangement position of the pattern 116 in FIG. 20A. The address 96 may be determined when the data 93 are input.

Next, at step S3 the logic operation of the divided layouts 117 to 122 and the basic FIG. 102 is performed. As a result, the on/off information, where the aperture sections 115 on the lines L1 to L7 are which are the on-area 123 which does not deflect the beam 9, is stored as the data 93 for the second aperture array control. Moreover, the on/off information, where the aperture sections 115 on the lines L8 to L10 are the off-area 124 which deflects the beam 9, may be stored. Here, the creation of the exposure data is ended.

Continuously, the latter of the exposure method is executed. The exposure method is executed according to FIG. 7 similarly to the first embodiment.

Figure 20A:
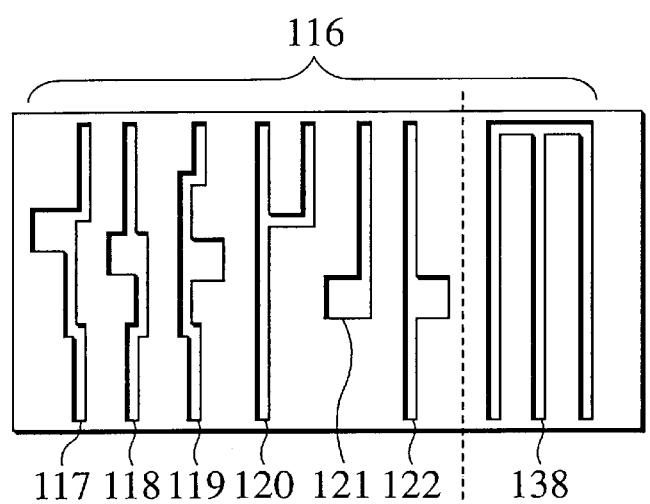
FIGS. 20A to 20C are diagrams for explaining the steps in the exposure method according to the third embodiment.
Figure 20B:
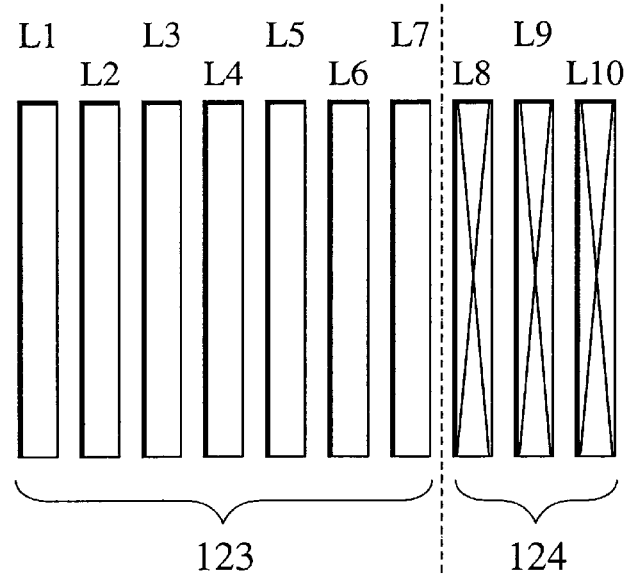
Figure 20C:
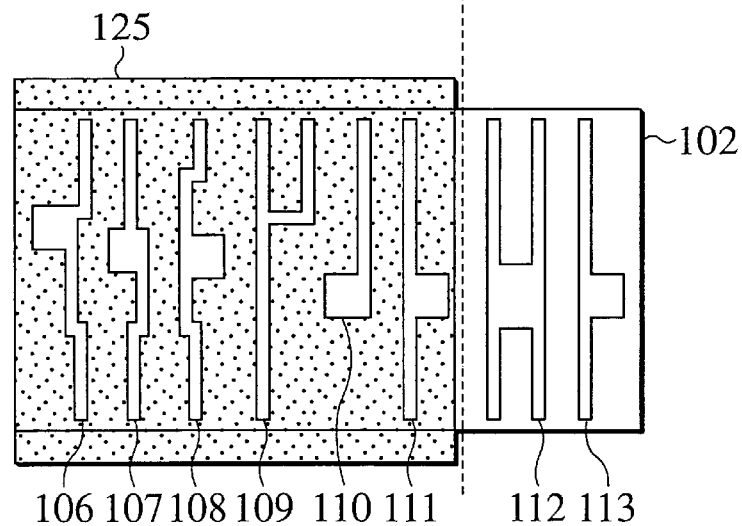

First, at step S11 the drawing position 95 of the pattern 116 in FIG. 20A is called. At step S12, the basic figure name of the pattern 102 and the on/off information of FIG. 20B are called. The steps S13 to S16 are executed. The second aperture array 114 allows the beam to be emitted therethrough at only the necessary portion 123 as shown in FIG. 20B, and deflects the beam at the other portion 124. As a result, as shown in FIG. 20C, the formed beam 125 is emitted only to the patterns 106 to 111 on the SC pattern 102. As a result, the desired patterns 117 to 122 shown in FIG. 20A can be exposed.

According to the third embodiment, the beam 9 is emitted only to the desired areas 106 to 111 of the cell pattern 126 on the aperture array 101, and the beam is not emitted to areas other than the desired areas 106 to 111. As a result, the plural cell patterns 103 to 105 are collective, and only the desired areas 103 and 104 are selected and the cell patterns are exposed. A number of the SC patterns arranged on the aperture array 101 can be reduced.

(Comparative Example of Third Embodiment)

Figure 21A:
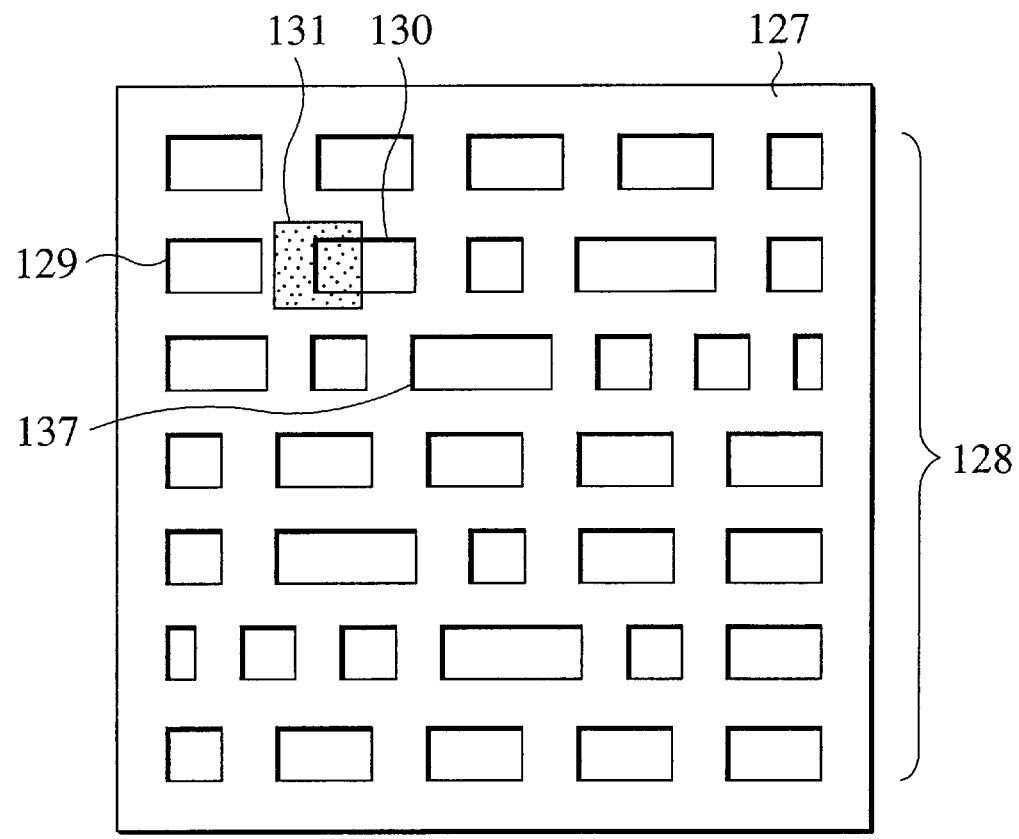
FIGS. 21A and 21B are diagrams for explaining the exposure method using a conventional CP aperture array.
Figure 21B:
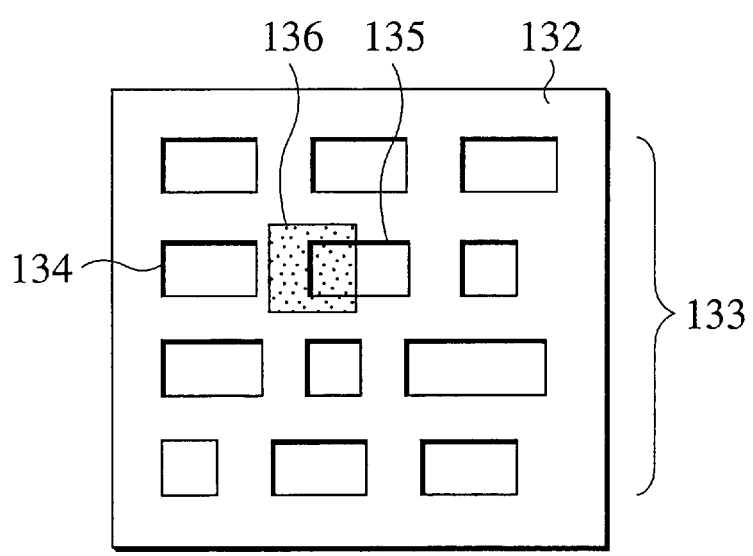

As the comparative example of the third embodiment, FIGS. 21A and 21B show arrangements of the CP apertures 128 and 133 on the CP aperture arrays 127 and 132 of the prior art.

In the case of the prior art shown in FIG. 21A, a beam 131 shaped by the first aperture is emitted onto a CP aperture 130. At this time, since the beam 131 is not emitted onto a CP aperture 129 which is another SC pattern, it is necessary to provide a wide interval between the SC patterns (apertures) 130 and the 129. For this reason, in the case where the same number of the CP apertures 128 as the third embodiment are mounted, it is necessary to enlarge the CP aperture array 127 and the beam deflection area.

In addition, when the CP aperture array 132 has the same size as the third embodiment, as shown in FIG. 21B, only a small number of SC patterns 133 (apertures) can be mounted. A beam 136 shaped by the first aperture is emitted onto a CP aperture 135. At this time, since the beam 136 is not emitted onto a CP aperture 134 which is another SC pattern, it is necessary to provide a wide interval between the SC patterns (apertures) 135 and the 134.

On the contrary, in the third embodiment, as shown in FIG. 18A, a lot of SC patterns 126 can be arranged with narrow intervals.

(Fourth Embodiment)

The fourth embodiment will explain the case where the basic figures of the basic figure apertures are oblique wiring patterns.

Also in the fourth embodiment, the exposure apparatus used in the first embodiment is used. The feature of the fourth embodiment is that oblique wiring patterns 143 and 144 are arranged on a third aperture array (basic figure aperture array) 142 as shown in FIG. 22B. The oblique wiring pattern 143 is the oblique wiring pattern from the upper left to the lower right. The oblique wiring pattern 143 has eleven apertures R1 to R11. The oblique wiring pattern 144 is the oblique wiring pattern from the upper right to the lower left. The oblique wiring pattern 144 has eleven apertures L1 to L11. Here, the oblique wirings are wirings which are arranged in the LSI layout so as to form an angle with a set base line which is not parallel nor vertical with the base line. This base line may be a base line as a reference of stepping presumed at the time of exposure. In FIG. 22B, respective sides of the array 142 may be set as base lines. In this case, the oblique wiring patterns 143 and 144 are inclined 45° with respect to the base lines. However, the inclined angle is not limited to 45°, and may be 30° or 60°. Namely, the inclination can be set to an arbitrary angle. Moreover, some kinds of angles may be combined as to be 30° and 60°. In the LSI layout, in addition to the wirings which are parallel with or vertical to the base lines, the oblique wirings are provided. The third aperture array 142 of FIG. 22B also has aperture 145 for a VBS exposure.

Figure 22A:
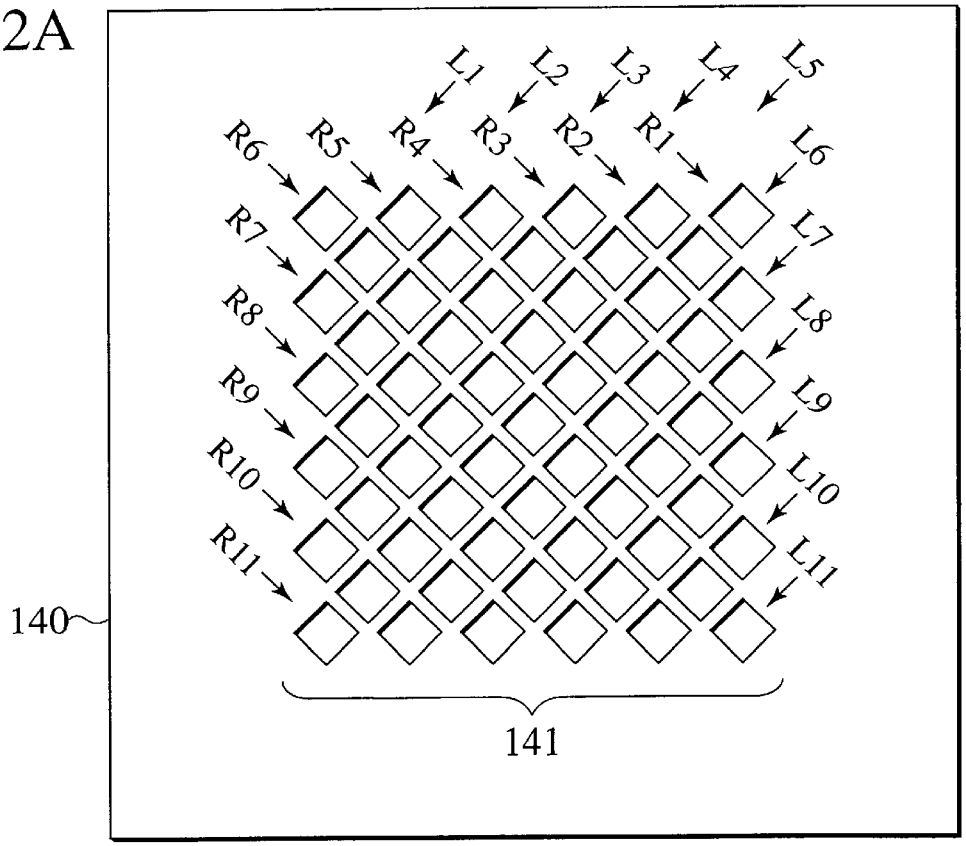
FIG. 22A is an upper surface diagram of the second aperture array (blanking aperture array) according to the fourth embodiment.
Figure 22B:
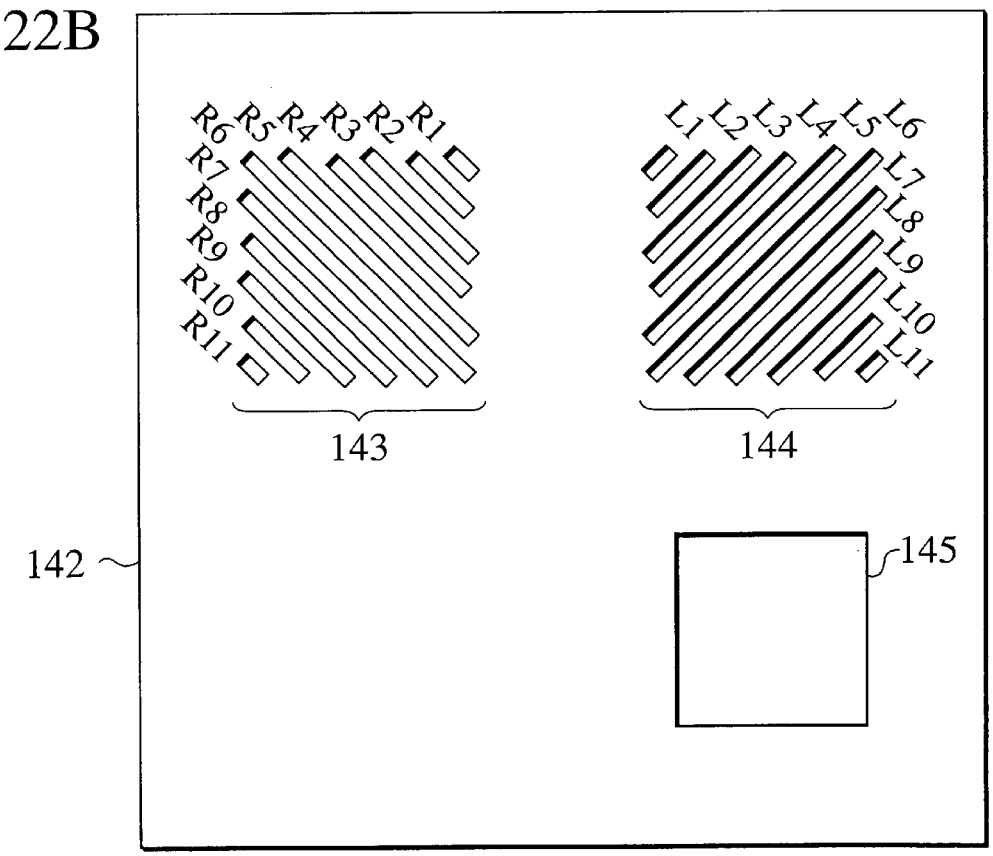
FIG. 22B is an upper surface diagram of the third aperture array (basic figure aperture array) according to the fourth embodiment.
Figure 23:
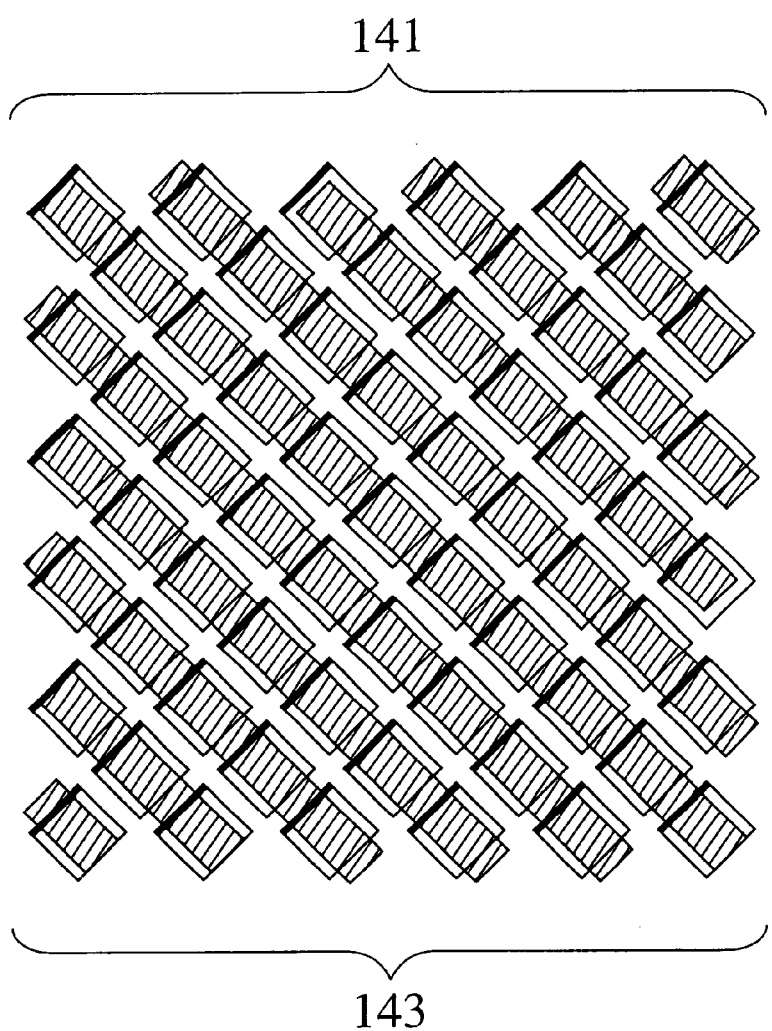
FIG. 23 is a diagram showing a positional relationship between the second aperture array and the third aperture array according to the fourth embodiment.

Further, aperture sections 141 shown in FIG. 22A are formed on the second aperture array 140 used in the fourth embodiment correspondingly to the forms of the oblique wiring patterns 143 and 144 on the third aperture array 142. The aperture sections 141 and the oblique wiring pattern 143 can be arranged so as to establish a positional relationship shown in FIG. 23 due to reduction and enlargement. This positional relationship can be regarded as the same positional relationship as FIG. 5A. Moreover, the aperture sections 141 and the oblique wiring pattern 144 can be arranged so as to establish the same positional relationship as FIG. 23 due to reduction and enlargement.

Figure 24A:
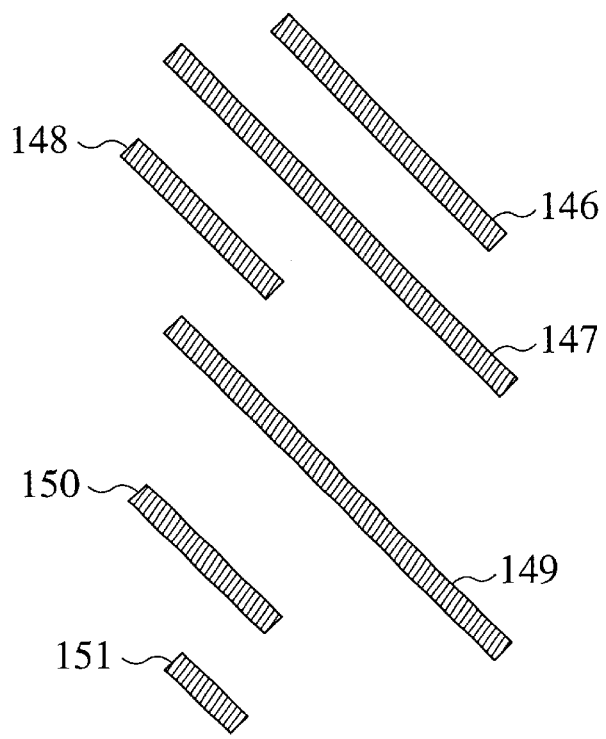
FIGS. 24A and 24B are diagrams for explaining the steps in the exposure method according to the fourth embodiment.
Figure 24B:
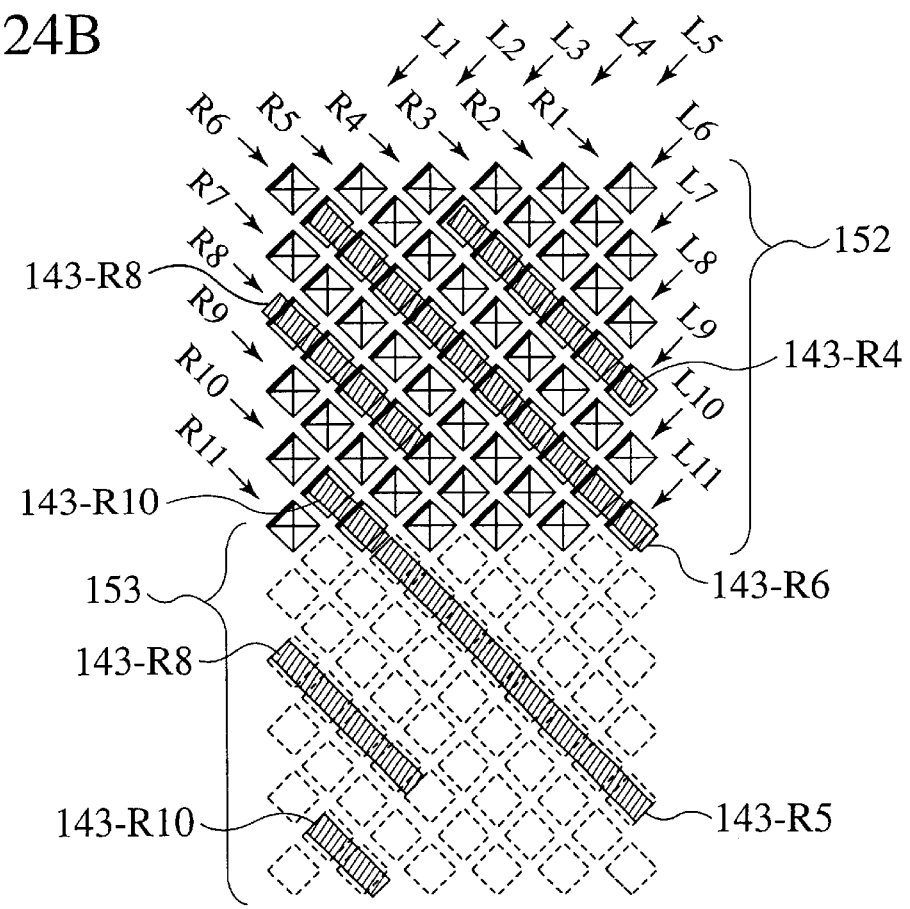

Next, there will be explained below the exposure method according to the fourth embodiment. For example, patterns 146 to 151 shown in FIG. 24A are exposed. In the fourth embodiment, as shown in FIG. 24B, the exposure is divided into two shot areas 152 and 153, and the aperture sections 141 on the second aperture array 140 are individually controlled so that the pattern 143 is exposed.

Similarly to the first embodiment, the exposure data are created according to FIG. 6.

At step S1, the layout patterns 146 through 151 are divided into the sizes of the basic figure apertures 143 and 144. As a result, as shown in FIG. 24B, the patterns 146 through 151 are divided in the areas 152 and 153.

At step S2 since the divided layout patterns are oblique wirings from the upper left to the lower right, they are classified as the pattern 143 for the oblique wiring from the upper left to the lower right.

The steps S1 and S2 are executed so that the drawing data 92 can be created. The basic figure names of the data 94 for the third aperture array of the drawing data 92 are identification symbols of the pattern 143. Moreover, the drawing positions of the data 95 for sample are an arrangement position of the patterns 146 to 151 in FIG. 24. The address 96 may be determined when the data 93 are input.

Next, at step S3 the logic operation of the divided layouts 146 to 151 and the basic FIG. 143 is performed. As a result, the on/off information 93, which shows that the aperture sections 141 on R4 and L4 to L9, the aperture sections 141 on R6 and L2 to L11, the aperture sections 141 on R8 and L13 through L6 and the aperture sections 141 on R10 and L6 and L7 are on areas where the beam 9 is not deflected, is stored as the data 93 for the second aperture array control into the area 152. Similarly, the on/off information is stored into the area 153, and the creation of the exposure data is ended.

Continuously, the latter half of the exposure method is executed. The exposure method is executed according to FIG. 7 similarly to the first embodiment.

First, at step S11 the drawing positions 95 of the patterns 146 to 151 in FIG. 24A are called. At step S12 the basic figure name of the pattern 143 and the on/off information 93 are called. Steps S13 to S16 are executed. As shown in the area 152 of FIG. 24B, the second aperture array 140 allows the beam to transmit at necessary portions, and the other portions deflect the beam. The shaped beam is emitted only to R4, R6, R8 and R10 of the pattern 143. As a result, the oblique wiring patterns 146 to 151 shown in FIG. 24A can be exposed.

(Modified Example of Fourth Embodiment)

The modified example of the fourth embodiment will explain the case where the basic figures of the basic figure apertures are oblique wiring patterns.

In the modified example of the fourth embodiment, the exposure apparatus used in the first embodiment is used. The feature of the modified example of the fourth embodiment is that oblique wiring patterns 163 and 164 are arranged on a third aperture array 162 as shown in FIG. 25B. The oblique wiring pattern 163 is an oblique wiring pattern from the upper left to the lower right. The oblique wiring pattern 163 has ten apertures R1 to R10. The oblique wiring pattern 164 is an oblique wiring pattern from the upper right to the lower left. The oblique wiring pattern 164 has ten apertures L1 to L10. The third aperture array 142 shown in FIG. 25B has aperture 145 for a VSB exposure.

Figure 25A:
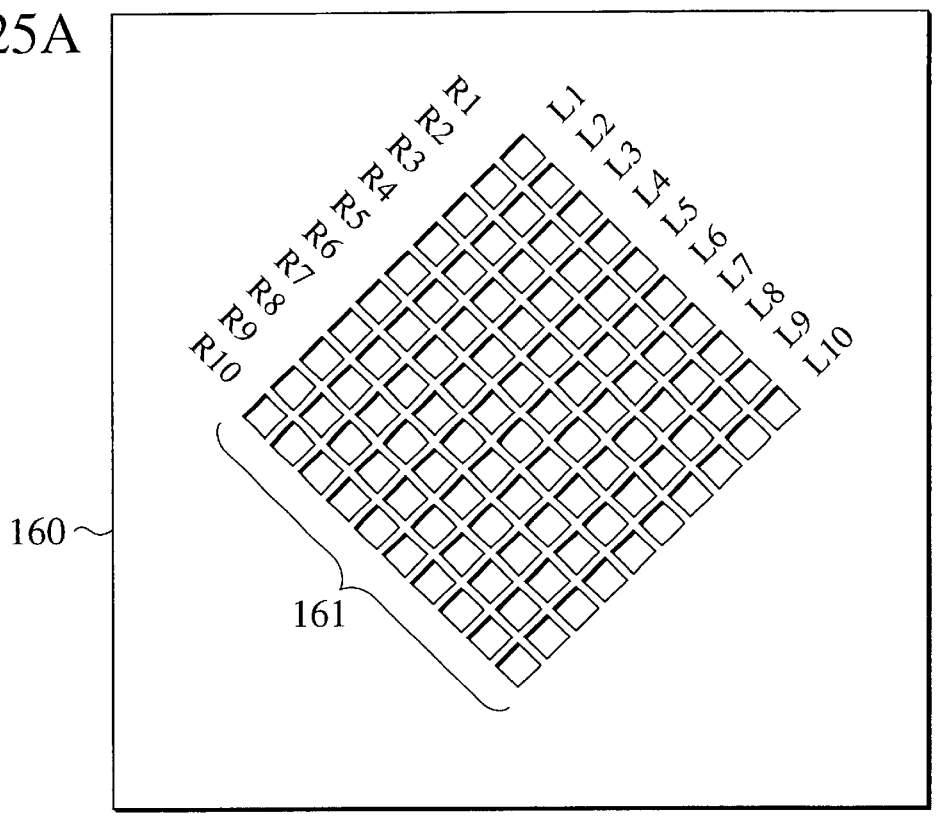
FIG. 25A is an upper surface diagram of the second aperture array (blanking aperture array) according to a modified example of the fourth embodiment.
Figure 25B:
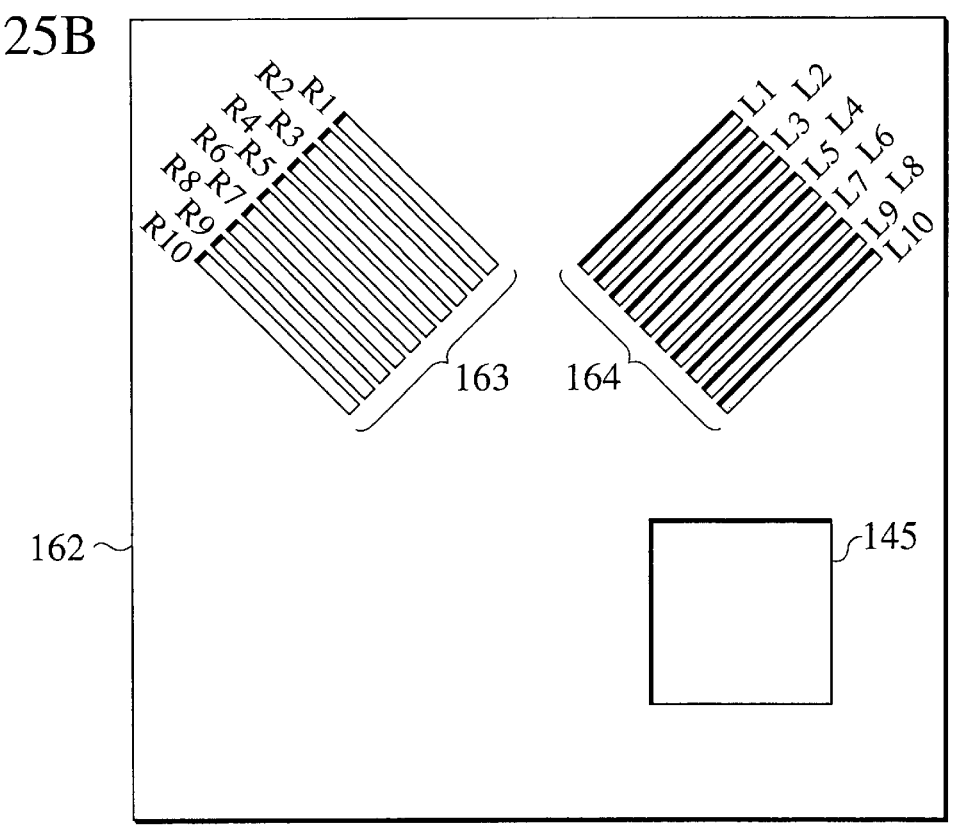
FIG. 25B is an upper surface diagram of the third aperture array (basic figure aperture array) according to the modified example of the fourth embodiment.
Figure 26:
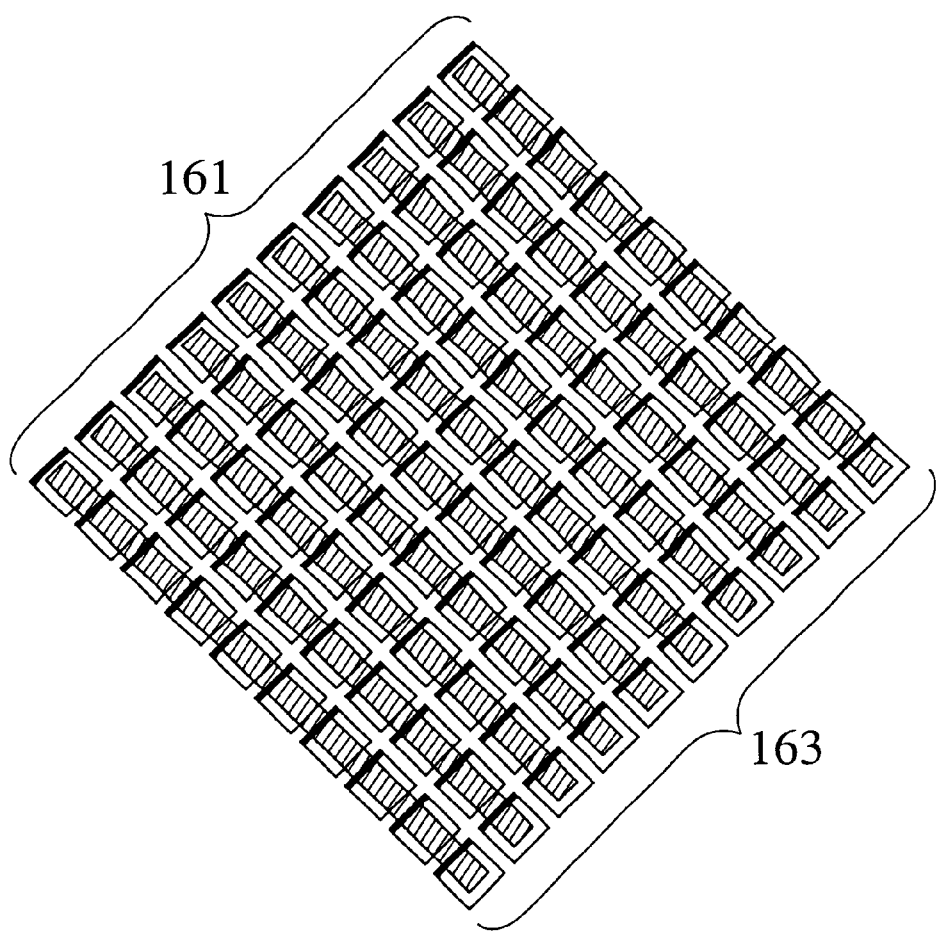
FIG. 26 is a diagram showing a positional relationship between the second aperture array and the third aperture array according to the modified example of the fourth embodiment.

Further, aperture sections 161 shown in FIG. 25A are formed on a second aperture array 160 to be used in the modified example of the fourth embodiment correspondingly to the forms of the oblique wiring patterns 163 and 164 of the third aperture array 162. The aperture sections 161 and the oblique wiring pattern 163 can be arranged so as to establish a positional relationship shown in FIG. 26 due to reduction and enlargement. This positional relationship can be regarded as the same positional relationship as FIG. 5A. Moreover, the aperture sections 161 and the oblique wiring pattern 164 can be also arranged so as to establish a positional relationship shown in FIG. 26 due to reduction and enlargement.

Figure 27:
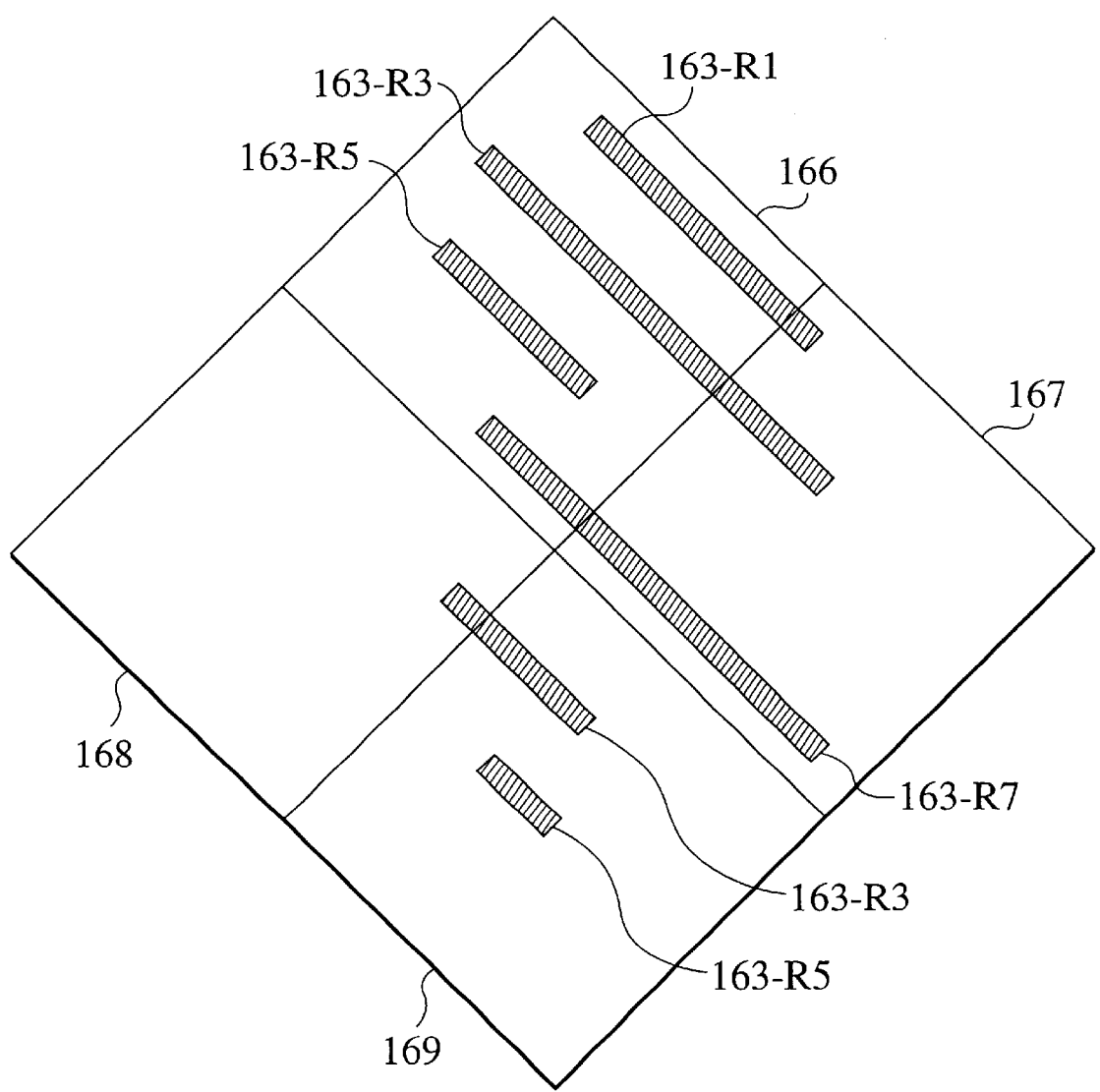
FIG. 27 is a diagram for explaining the exposure method according the modified example of the fourth embodiment.

Next, there will be explained below the exposure method according to the modified example of the fourth embodiment. Similarly to the fourth embodiment, the patterns 146 to 151 shown in FIG. 24A are exposed. In the modified example of the fourth embodiment, as shown in FIG. 27, the exposure is divided into four shot areas 166 to 169, and the aperture sections 161 on the second aperture array 160 are individually controlled so that the pattern 163 is exposed.

First, similarly to the first embodiment, the exposure data are created according to FIG. 6.

At step S1 the layout patterns 146 to 151 are divided into the sizes of the basic figure apertures 163 and 164. As a result, as shown in FIG. 27, the layouts are divided in the areas 166 to 169.

At step S2 since the divided layout patterns 146 to 151 are oblique wiring from the upper left to the lower right, they are classified as the oblique wiring pattern 163 from the upper left to the lower right.

The steps S1 and S2 are executed so that the drawing data 92 can be created. The basic figure name of the data 94 for the third aperture array of the drawing data 92 is the identification symbol of the pattern 163. Moreover, the drawing position and the address 96 of the data 95 for sample may be determined similarly to the fourth embodiment.

Next, at step S3 the logic operation of the divided layouts 146 to 151 and the basic FIG. 163 is performed. As a result, the on/off information 93, which shows that the aperture sections 161 on R1 and L4 to L8 and the aperture sections 161 on R3 and L2 to L8 and the aperture sections 161 on R5 and L3 to L6 and the aperture sections 161 on R7 and L6 and L7 are on areas which do not deflect the beam 9, is stored as the data 93 for the second aperture array control in the area 166, for example. Similarly, the on/off information is stored in the areas 167 to 169, and the creation of the exposure data is ended.

Continuously, the latter half of the exposure method is executed. The exposure method can be executed according to FIG. 7 similarly to the fourth embodiment. The beam 9 shaped by the second aperture array 160 is emitted only to R1, R3, R5 and R7 of the pattern 163. As a result, the oblique wiring patterns 146 to 151 shown in FIG. 24A can be exposed.

In such a manner, when some basic figure apertures to be reference are created, one basic figure aperture A1, 102, 143, 163 or the like can be applied to a plurality of patterns according to the beam shape of the second aperture arrays 3, 114, 140 and 160. Moreover, the exposure data are divided into the drawing data A (93) and the data B for the second aperture array control (93) so that the exposure data 91 can be compressed.

The first embodiment to the fourth embodiment 4 are not limited to an acceleration voltage at the time of pattern exposure. In the first embodiment to the fourth embodiment, the acceleration voltage at the time of pattern exposure is 5 kV, but the acceleration voltage at the time of pattern exposure may be a low energy electron beam of 5 kV or less. Moreover, similarly the embodiments 1 through 4 can be applied to the case where the pattern exposure is carried out with the acceleration voltage of 5 kV or more. Further, the first embodiment to the fourth embodiment are not limited to types of the electron beam exposure apparatus. For example, a CP exposure type electron beam exposure apparatus, a variable shaping type electron beam exposure apparatus, multibeam type electron beam exposure apparatus, a disc beam type electron beam exposure apparatus or an electron-beam mask transfer system type electron beam exposure apparatus can be combined with the first embodiment to the fourth embodiment so as to be capable of being used.

Various modifications will become possible for those skilled in the art after receiving the teachings of the present disclosure without departing from the scope thereof.

What is claimed is:

1. A charged beam exposure apparatus comprising:
   a charged beam generating source;
   a first flat board which has a plurality of first aperture sections having rectangular apertures arranged close to one another and electrodes for deflecting the beam passing through the first aperture sections at the respective apertures; and
   a second flat board which is arranged parallel with said first flat board and has second aperture sections having basic figure apertures for shaping the beam, which passes or passed through the first aperture sections,
   wherein a ratio of a width of the first aperture sections to an interval between the first aperture sections is larger than a ratio of a width of the second aperture sections to an interval between the second aperture sections.

2. The charged beam exposure apparatus as in claim 1, further comprising:
   a first deflector to emit the beam passed through the first aperture sections to the second aperture section;

a second deflector to emit the beam passed through the second aperture section to an arbitrary position of a sample; and a lens to image the beam passed through the second aperture section onto the sample.

3. The charged beam exposure apparatus as in claim 1, wherein the first aperture sections are arranged cyclically.

4. The charged beam exposure apparatus as in claim 1, wherein said first flat board has the aperture sections and the electrodes according to LSI wiring pitches.

5. The charged beam exposure apparatus as in claim 1, wherein said second flat board has the basic figures according to LSI wiring pitches.

6. The charged beam exposure apparatus as in claim 1, wherein a form of the apertures of the second aperture sections has linear wiring patterns in vertical and horizontal directions.

7. The charged beam exposure apparatus as in claim 6, wherein a form of the apertures of the second aperture sections further has a connection pattern which connects vertical and horizontal wirings.

8. The charged beam exposure apparatus as in claim 1, wherein a form of the apertures of the second aperture sections has a linear wiring pattern in a direction where a vertical direction and a horizontal direction do not form a right angle.

9. The charged beam exposure apparatus as in claim 1, wherein a form of the apertures of the second aperture sections has a standard cell pattern.

10. The charged beam exposure apparatus as in claim 1, wherein the second aperture sections comprises:

first slits which are arranged parallel with vertical sides of the rectangles and opposed to one another with equal intervals; and second slits which are arranged parallel with horizontal sides of the rectangles and opposed to one another with equal intervals.

11. The charged beam exposure apparatus as in claim 10, wherein lengths of the first slits are equal, and both end portions are arranged on a line, and their number is the same as a number of lines of the first aperture sections, the first aperture sections being arranged cyclically.

12. The charged beam exposure apparatus as in claim 10, wherein lengths of the second slits are equal, and both end portions are arranged on a line, and their number is the same as a number of rows of the first aperture sections, the first aperture sections being arranged cyclically.

* * * * *